(12) United States Patent
Kanda et al.

(10) Patent No.: US 6,905,928 B2
(45) Date of Patent: Jun. 14, 2005

(54) MOS TRANSISTOR APPARATUS AND METHOD OF MANUFACTURING SAME

(75) Inventors: Naoki Kanda, Sagamihara (JP); Arito Ogawa, Nei (JP); Eisuke Nishitani, Yokahama (JP); Miwako Nakahara, Yokahama (JP); Tadanori Yoshida, Hitachinaka (JP); Kiyoshi Ogata, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/143,192

(22) Filed: May 9, 2002

(65) Prior Publication Data
US 2003/0183901 A1 Oct. 2, 2003

(30) Foreign Application Priority Data

May 9, 2001 (JP) .................................. 2001-138520
Apr. 19, 2002 (JP) .................................. 2002-116977

(51) Int. Cl.[7] ........................................... H01L 21/336
(52) U.S. Cl. ...................... 438/260; 438/299; 438/301
(58) Field of Search ............................... 438/260–262, 438/299–306, 149–153

(56) References Cited

U.S. PATENT DOCUMENTS 5,907,789 A * 5/1999 Komatsu .................... 438/649
6,191,445 B1 * 2/2001 Fujiwara ..................... 257/321
6,288,943 B1 * 9/2001 Chi ......................... 365/185.18
6,605,520 B2 * 8/2003 Cheong ...................... 438/592

OTHER PUBLICATIONS

Wen–Chin Lee, et al., "Investigation of Poly–$Si_{1-x}Ge_x$ for Dual–Gate CMOS Technology," *IEEE Electron Device Letters* (Jul. 1998), 19(7):247–49.

Kazuya Uejima, et al., "Highly Reliable Poly–SiGe/Amorphous–Si Gate CMOS," Silcon Systems Research Labs., System Device and Fundamental Research, NEC Corporation (2000 IEEE), 4 pages.

* cited by examiner

*Primary Examiner*—H. Jey Tsai
(74) *Attorney, Agent, or Firm*—Townsend and Townsend and Crew LLP

(57) ABSTRACT

When polycrystalline silicon germanium film is used for gate electrodes in a MOS transistor apparatus, there have been problems of reduced reliability in the gate insulating film, due to stress in the silicon germanium grains. Therefore, a polysilicon germanium film is formed, after forming silicon fine particles of particle size 10 nm or less on an oxide film. As a result, it is possible to achieve a high-speed MOS transistor apparatus using an ultra-thin oxide film having a film thickness of 1.5 nm or less, wherein the Ge concentration of the polycrystalline silicon germanium at its interface with the oxide film is uniform, thereby reducing the stress in the film, and improving the reliability of the gate electrode.

2 Claims, 39 Drawing Sheets

FIG.12
(a)
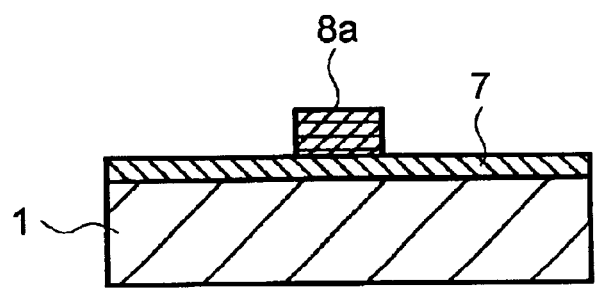
(b)
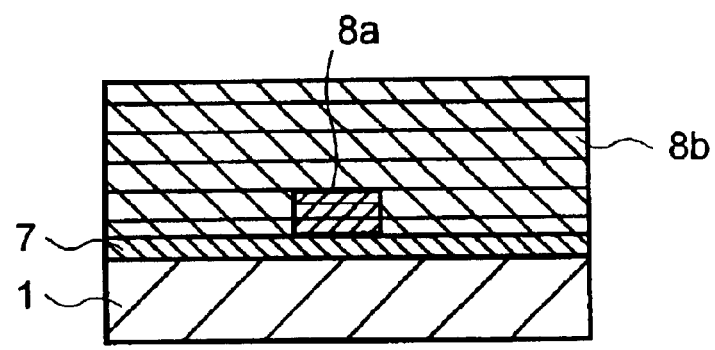
(c)
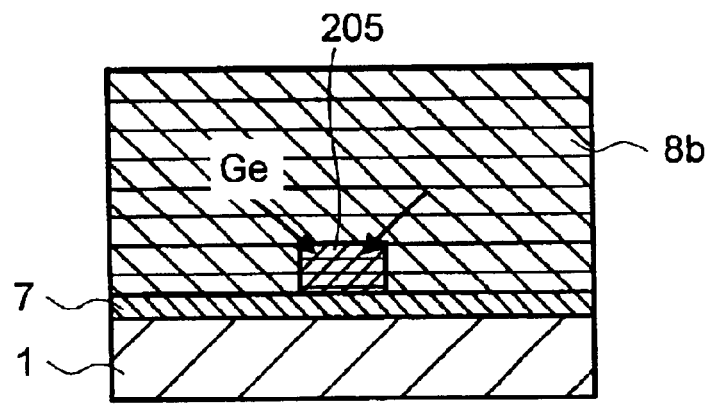

FIG.13
(a)
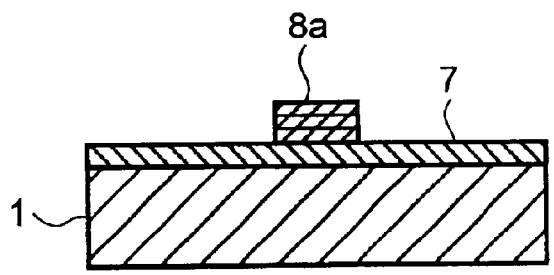
(b)
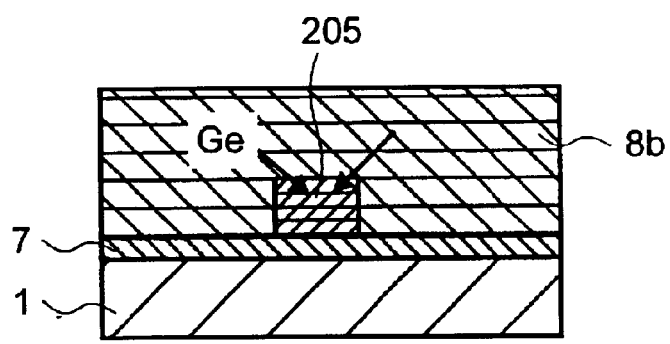
(c)
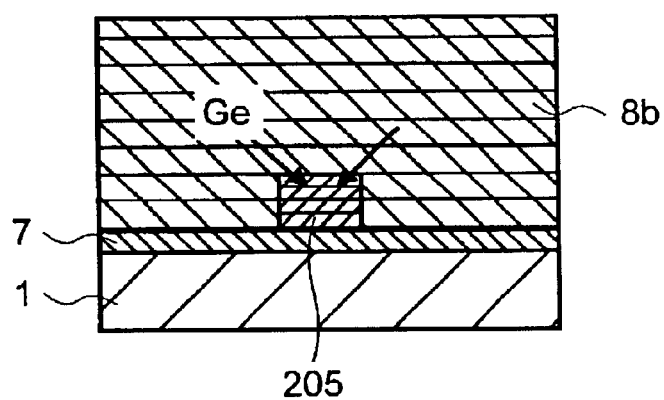

FIG.15
(a)
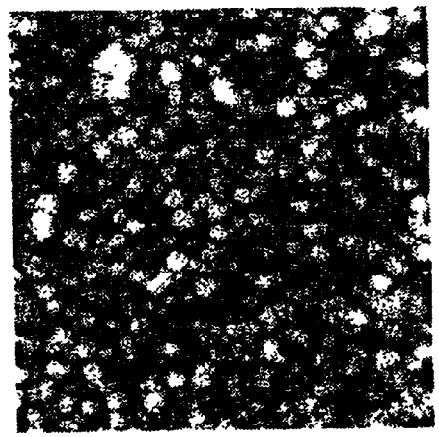
650°C
(b)
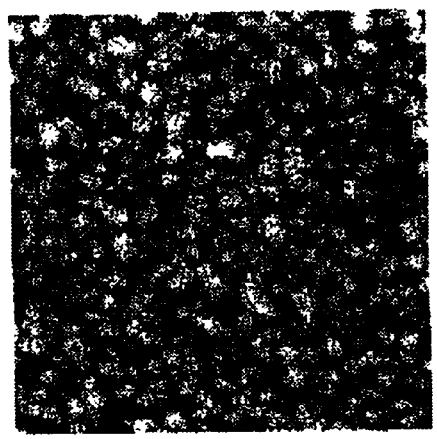
600°C
(c)
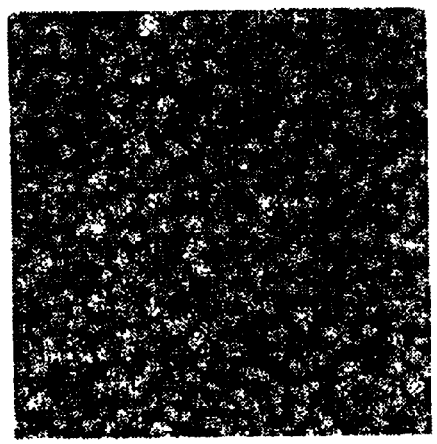
550°C

FIG.17
(a)
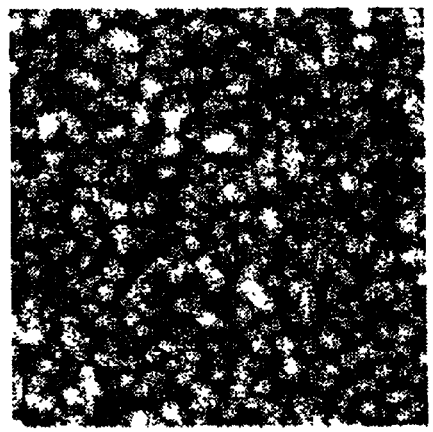
60Pa
(b)
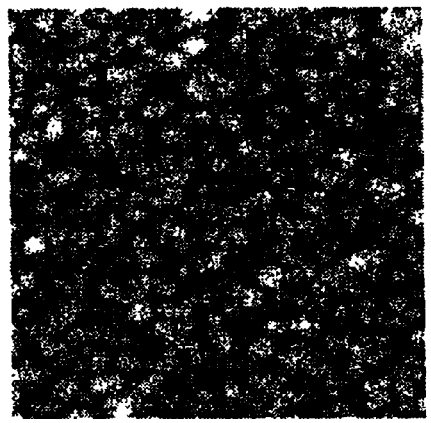
90Pa
(c)
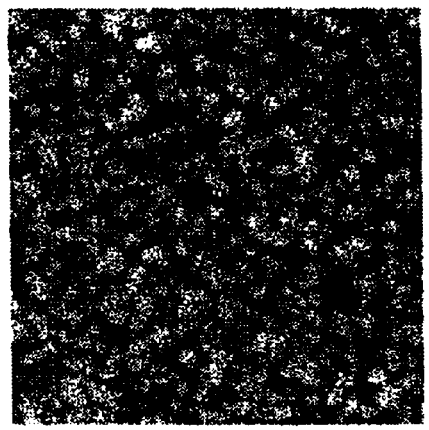
120Pa

FIG.19
(a)
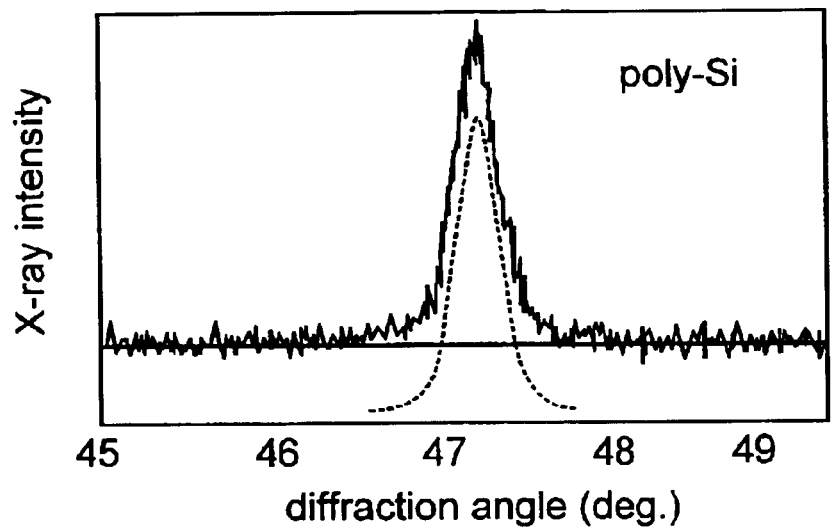
(b)
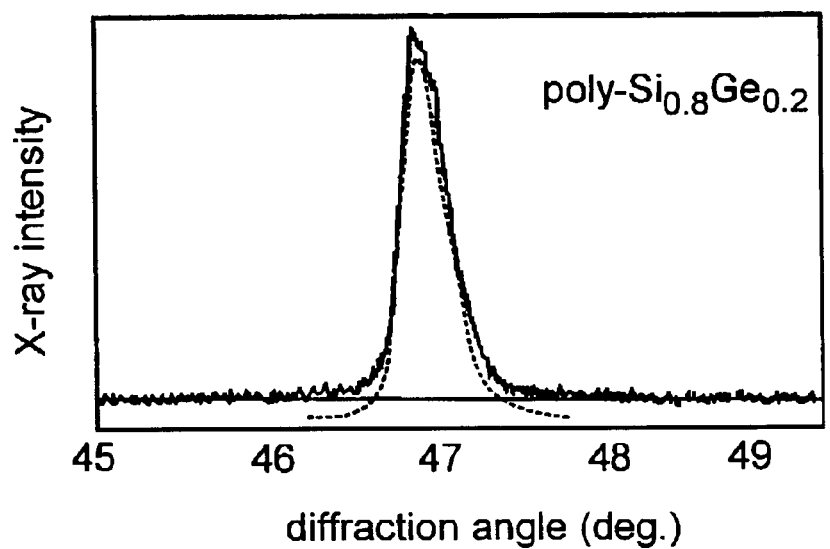

FIG. 24
(a)
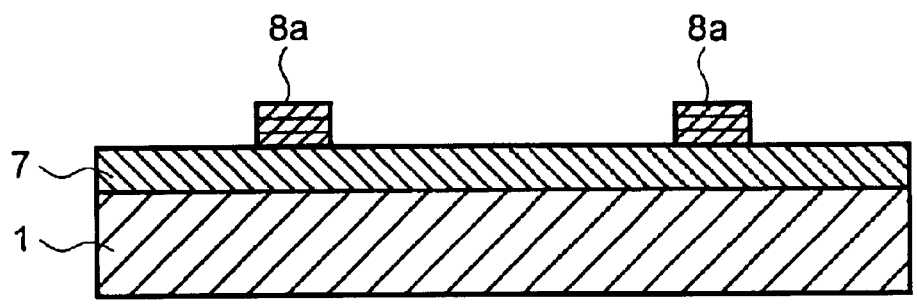
(b)
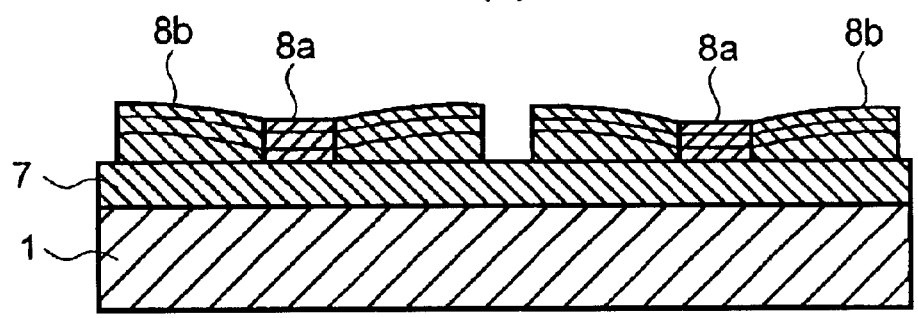
(c)
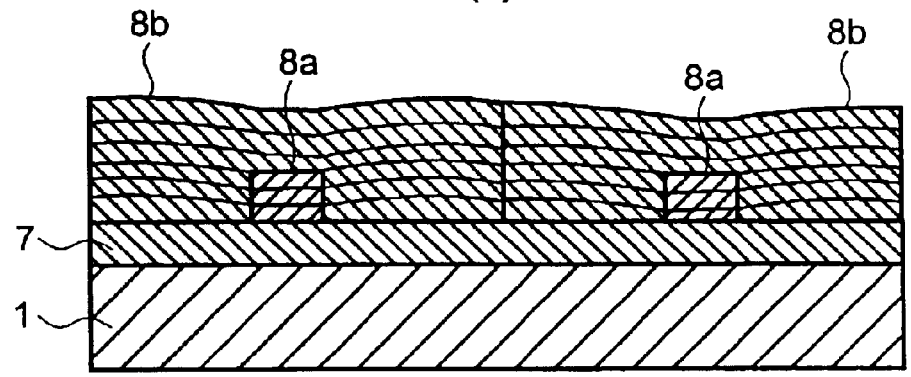

FIG.25
(a)
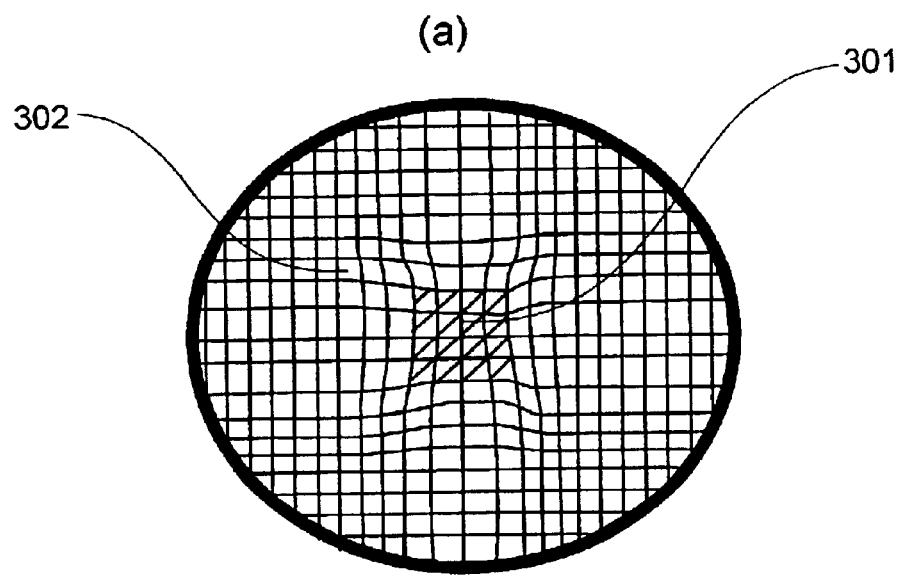
(b)
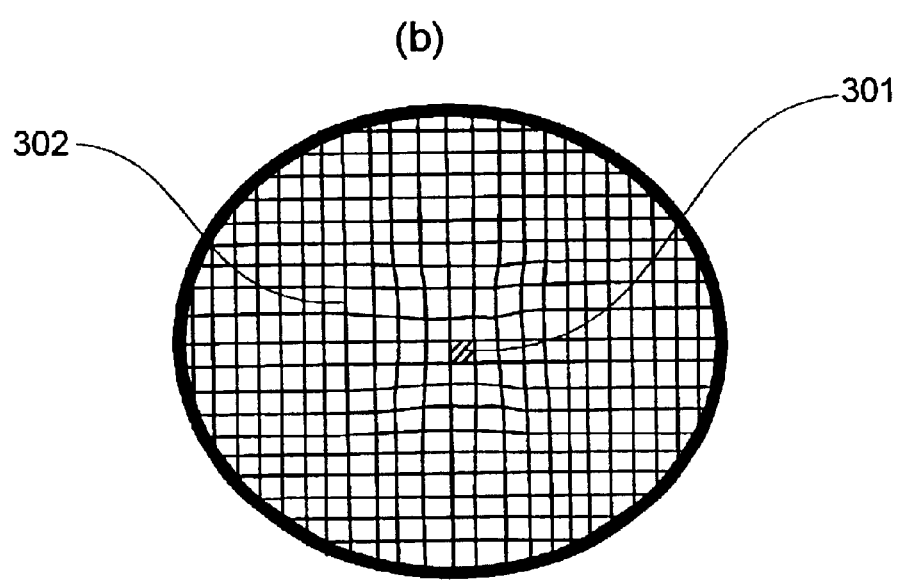

FIG.27
(a)
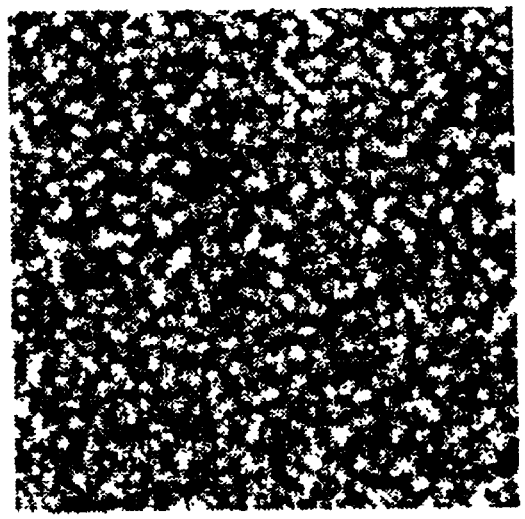
100nm
(b)
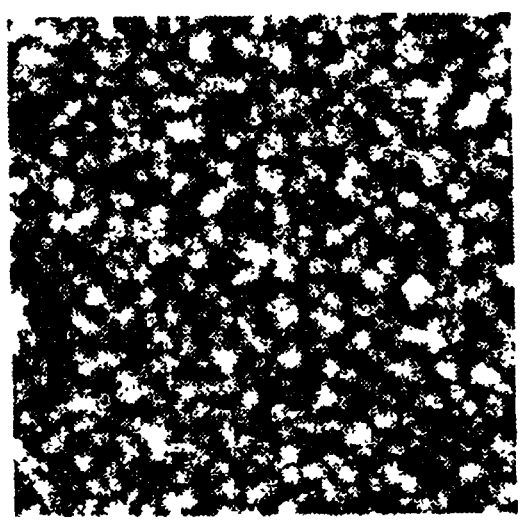
200nm

FIG.30
(a)
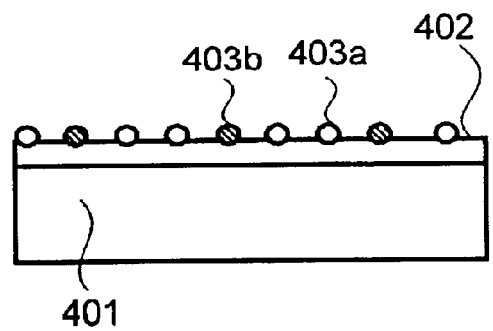
(b)
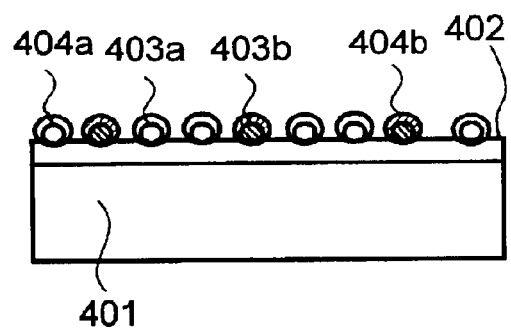
(c)
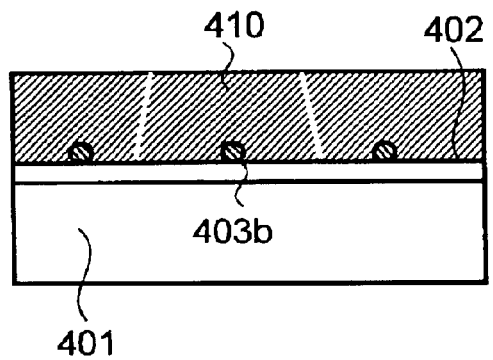

FIG.39
(a)
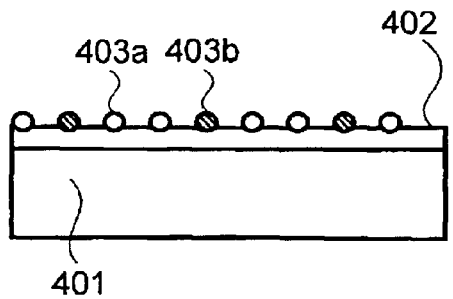
(b)
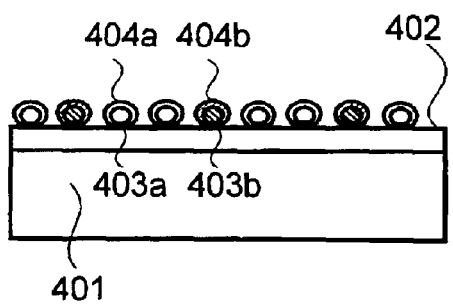
(c)
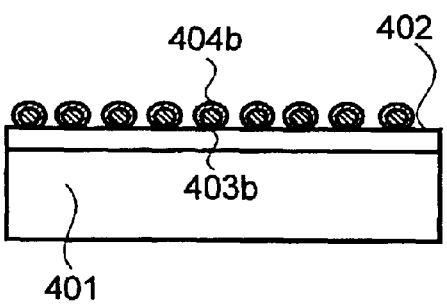
(d)
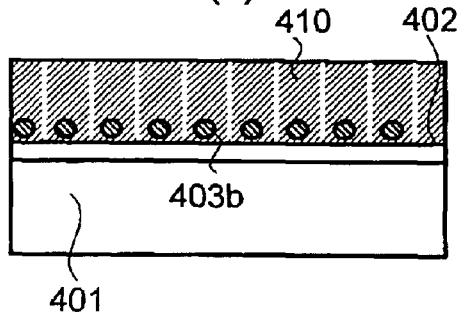

FIG.43
(a)
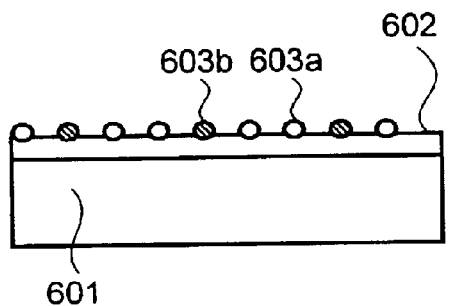
(b)
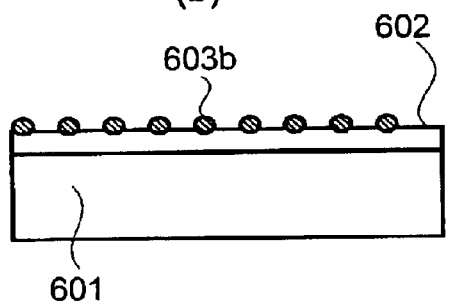
(c)
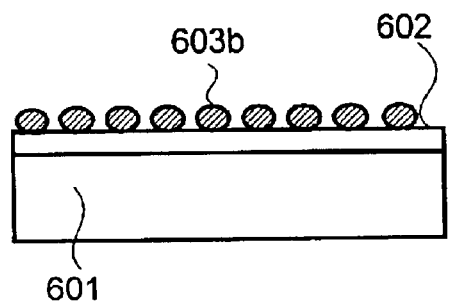
(d)
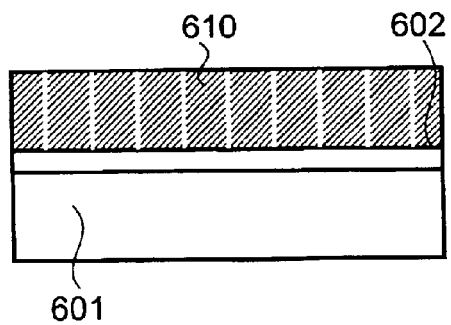

MOS TRANSISTOR APPARATUS AND METHOD OF MANUFACTURING SAME

CROSS-REFERENCE TO RELATED APPLICATIONS

The present application is related to and claims priority from Japanese Application No. 2002-116977, filed Apr. 19, 2002 and from Japanese Application No. 2001-138520, filed May 9, 2001.

BACKGROUND OF THE INVENTION

1. Field of the Invention

The present invention relates to a highly reliable MOS transistor devices wherein a semiconductor film and metallic film comprising fine crystals are used as a gate electrode.

2. Description of the Related Art

Gate oxide films in MOSFETs (Metal Oxide Semiconductor Field Emission Transistor, hereinafter, abbreviated as "MOS transistor") have successively been reduced in thickness on the basis of the scaling rule proposed by R. Dennard, but at thicknesses of 3 nm or less, there have been concerns regarding the increase in leakage current due to tunnel effects at low voltages. However, it has been confirmed that even if a tunnel current is flowing, a MOS transistor devices can be made to operate normally by shortening the gate length, and MOS transistor devices using gate oxide films of 1.5 nm or less have been achieved. Investigation has also been conducted into oxide equivalents of 1.0 nm or less, wherein materials such as silicon nitride, tantalum oxide, or the like, having higher dielectric constant than silicon oxide film are used for the gate insulating film. In an ultra-thin oxide film of this kind, there is significant increase in capacitance due to depletion in the gate electrode, and suppression of such depletion is a problem.

With this reduction in the thickness of gate insulation films, it has been essential to adopt new materials generating less depletion, instead of conventional impurity-doped polysilicon films, as the gate electrode material. In order to reducing this depletion, methods using metallic gates have been investigated, but processing problems relating to interface control, and the like, have arisen, and such methods have not yet been achieved. On the other hand, in methods for reducing depletion by using the same process currently adopted for polysilicon, attention has been focussed on polysilicon germanium films.

Gate depletion is particularly marked in PMOS devices using boron having a low activation rate, but with polysilicon germanium, since the boron active concentration is higher than in polysilicon, it is possible to suppress depletion.

When a polysilicon germanium film is formed on an oxide film, the crystal grains enlarges, leading to deterioration in the breakdown voltage of the gate insulating film. Accordingly, Wen-Chin Lee et. al., for example, in IEEE Electron Device Letters, Vol. 19, No. 7, p.247–249, have used a method wherein a silicon film is inserted in order to achieve finer crystal grains. Moreover, at the International Electron Device Meeting 2000, Ueshima, et. al., presented a method for improving reliability by providing a 3 nm amorphous silicon film as a barrier layer at the interface between polysilicon germanium and oxide film, thereby improving the gate oxide film interface.

SUMMARY OF THE INVENTION

It is known that the breakdown voltage of the gate insulating film is degraded by enlargement of the crystal grains in the vicinity of the interface with the oxide film, when a polycrystalline electrode film is formed on the gate insulating film. In sub-0.1 μm CMOS devices, a gate electrode particle size of 30 nm or less, and especially, 20 nm or less, is desirable at the interface, to ensure the reliability of the gate insulating film. Therefore, methods for increasing the generation of nuclei have been proposed as a technique for controlling the size of polysilicon grains. For example, U.S. Pat. No. 2,951,319 discloses low-temperature film formation, Patent No. (Hei)10-041245 discloses high-pressure film formation, and Patent No. (Hei)10-256404 discloses a method for forming a film after causing adsorption of halogen gas into the oxide film surface. Here, it is thought that the nuclei generated in the initial stage grow in a horizontal direction, particle interfaces being created when these nuclei impact in the same plane, thereby determining the grain size of the polycrystalline film. However, according to our research, it was found that at a polysilicon film forming temperature of 400–800° C., the initial nuclei of diameter 10 nm or less do not crystallize enough, and therefore, even if the concentration of nucleus generation is increased, particle growth will occur due to mutual bonding during film growth, and the resulting grain size in the vicinity of the oxide film interface after crystallization will not reduce below 30 nm. If the film forming temperature is raised to 800° C. or above, then crystallization occurs, but such a temperature cannot be used, because the SiH4 starter material will decompose in the gas phase.

In particular, with silicon germanium films, the nucleus generation density is low on the oxide film, and hence the grains become coarser and it is difficult to reduce the grain size at the interface. Introducing a silicon film is an effective method of preventing enlargement of the grains, but still the grain size cannot be reduced below 30 nm, similarly to a polysilicon film. However, if an amorphous silicon film is used as a barrier layer, then the Ge concentration in the amorphous silicon layer falls by 30% or more, and the depletion suppression effect is diminished. If the Ge composition in the polysilicon germanium film is increased in order to raise the Ge concentration at the oxide film interface and hence suppress depletion, then the grain size will increase, and the reliability of the gate oxide film will decline.

Moreover, in this method, since amorphous silicon is used for the gate oxide film, then the silicon will crystallize if the temperature is raised, and hence processing must be performed at low temperature, resulting in long processing times. Consequently, although this method is suitable for batch type manufacturing methods, it is not readily applicable to single wafer manufacturing methods aimed at fabricating a small number of products.

In a metal gate process using a metal film, the effect on the reliability of the gate electrode increases, as the gate insulating film is made thinner. In order to eliminate the damages on the insulating film by the gate electrode stress, it is possible to use an amorphous metal film by low-temperature film forming, but since a temperature of 500° C. or above is required to form the barrier film and inter-layer oxide films, the metal film cannot be maintained in an amorphous state. Under this thermal load, it crystallizes and marked enlargement of the grains occurs. Therefore, in a metal gate process also, it is preferable to use a polycrystalline film for the gate electrode. However, since the initially formed nuclei do not crystallize enough, the particle size in the vicinity of the interface cannot be reduced below 30 nm, similarly to the case of polysilicon. Moreover, since the transistor characteristics of a metal gate transistor vary according to the work function of the metal film, it is necessary that the metal crystals are aligned in orientation, even at the interface with the insulating film, and that the particle size is 20 nm or less.

It is an object of the present invention to provide a highly reliable MOS transistor devices and method of manufacturing same, whereby the form of the gate electrode film is optimized and deterioration of the gate insulating film is suppressed.

In order to achieve the aforementioned object, in the present invention, it is possible to form a semiconductor film or metal film in micro-crystalline form as a gate electrode, by forming a conducting film after supplying fine particles onto a gate insulating film. The grain size of the gate electrode film in the region contacting the insulating film should be 30 nm or less.

The semiconductor film is either Si, or Ge, or a combination of Si and Ge, and the metal film is a pure film, or an alloy, oxide, or nitride, including Cr, Mn, Fe, Nb, Mo, Hf, Ta, W, Al, Ni, Cu, Rh, Pd, Ag, In, Ir, Pt, Au, Pb, Ti, Co, Zn, Zr, Ru, or Cd.

In order to reduce variation in the work function, the metal film should have a grain size of 20 nm in the region contacting said insulating film, and the surface area occupied by the (111) face oriented crystals, in the case of a body centred cubic structure and the surface area of the (110) face oriented crystals, in the case of a face centred cubic structure, is 70% or more.

If the semiconductor film is silicon germanium, then a polycrystalline silicon germanium film and a polysilicon film are formed after forming a silicon film in an island shape on the oxide film. It is particularly desirable that the silicon film has the form of fine grains of size 10 nm or less, or of amorphous particles. Thereby, it is possible to suppress depletion without the Ge atom concentration of the polycrystalline silicon germanium film declining by more than 20% from the film composition, in the vicinity of the interface with the oxide film. Moreover, the Ge atom concentration at the oxide film interface can be set to a uniform value of 80% or above in the monocrystalline particles, and the lattice distortion of the polycrystalline structure can be reduced and the stress reduced. If using an amorphous island-shaped silicon film, this can be achieved by performing continuous film formation and simply changing the mixture ratio of SiH4 and GeH4, in a temperature range wherein the underlying silicon film is amorphous and the polycrystalline silicon germanium film is crystalline.

Moreover, it is also possible to reduce the stress by controlling the grain size of the polycrystalline silicon germanium film. This can be resolved by reducing the (200) orientation and keeping the maximum grain size to one half of the film thickness of less. Furthermore, the stress can also be reduced by keeping the thickness of the polycrystalline silicon germanium film to 30 nm or less. This can be achieved by forming a silicon film and a polycrystalline silicon germanium film of 20 nm or less in a temperature range in which the silicon film is amorphous, and then forming a polycrystalline silicon germanium film thereupon at high temperature.

Moreover, the aforementioned object can be achieved by forming a silicon film in amorphous form at isolated positions, and then heat treating the fine particles of silicon film to perform crystallization, whereupon a silicon germanium film is formed. Desirably, the size of the fine particles in the silicon film is 10 nm or less. Furthermore, the density of fine particles in the silicon film is $10^{11}$ cm$^{-2}$ or above.

The aforementioned object can also be achieved by forming metal film in amorphous form at isolated positions, and then heat treating the fine particles of metal film to perform crystallization, whereupon a metal film is formed. Desirably, the size of the fine particles in the metal film is 10 nm or less. The density of fine particles in the metal film is $10^{11}$ cm$^{-2}$ or above.

The formation of the fine particles can be achieved either by decomposing a source gas by heat or plasma energy, or by causing a liquid or solid starter material to evaporate by heat or laser irradiation or ion irradiation, or by forming electrochemically in a solution containing starting material components.

The heat treatment after formation of the fine particles can be achieved either by simply halting the supply of source gas at the film forming temperature, or by direct heating or radiation heating at a temperature above the film formation temperature, or by laser heating. Desirably, the heat treatment temperature is 700–1200° C. in the case of a semiconductor film, and the heat treatment temperature is 500–1200° C. in the case of metal film.

Desirably, after forming the fine particles, oxidation treatment is performed, followed by heat treatment, whereby crystallization can be performed whilst preventing agglomeration of the fine particles. Moreover, the aforementioned object can be achieved by removing the oxide by wet etching and then forming an electrode film. Instead of oxidization processing, it is also possible to perform heat treatment for crystallization in an oxygen gas atmosphere.

In order to achieve the object of the present invention, it is desirable to use a CVD apparatus which has a rapid heating mechanism based on a lamp or laser, in addition to providing direct heating of the substrate by means of a heater, or radiation heating thereof by means of an oven. Desirably, the rapid heating rate is 100° C./min or above.

BRIEF DESCRIPTION OF THE DRAWINGS

These and other features, objects and advantages of the present invention will become more apparent from the following description when taken in conjunction with the accompanying drawings, wherein:

FIG. 12 is a model view of Ge diffusion when a crystalline silicon film is used as an under film, and it depicts a sectional view of a gate electrode illustrating the diffusion of Ge atoms when the island-shaped silicon film is crystalline;

FIG. 13 is a sectional view of a gate electrode showing diffusion of Ge atoms when the island-shaped silicon film is amorphous silicon;

FIG. 15 is a diagram showing the surface shape of polysilicon germanium films formed at different temperatures to that in FIG. 14;

FIG. 17 is a diagram showing the surface shape of polysilicon germanium films formed at different pressures;

FIG. 19 is a characteristics graph of a polysilicon and a polysilicon germanium film based on X-ray diffraction;

FIG. 24 is a sectional view of a gate electrode for describing distortion in the initial growth of a silicon germanium film;

FIG. 25 is a model diagram showing lattice distortion in silicon germanium film crystals at the interface with an oxide film;

FIG. 27 is a diagram showing the surface shape of a polysilicon germanium film in the case of different film thicknesses;

FIG. 30 is a flowchart of a micro-crystal silicon germanium film forming process by means of forming silicon fine particles according to the present invention;

FIG. 39 is a flowchart of a fine grain silicon germanium film forming process by means of supplying crystalline fine particles having a two-layer structure of silicon and silicon germanium according to the present invention;

FIG. 43 is a schematic view of a sectional structure of a micro-crystalline tungsten film formed by supplying crystalline tungsten micro-crystal particles according to the present invention;

DESCRIPTION OF THE PREFERRED EMBODIMENTS

Modes of implementing the present invention are described below by means of various embodiments, with reference to the drawings.

There follows a description of a method of manufacturing a CMOSFET using polycrystalline silicon germanium by supplying silicon fine particles according to the present invention, with reference to FIG. 1 to FIG. 9.

FIG. 1 to FIG. 9 are cross-sectional views of respective stages of a CMOSFET for describing one embodiment of a method of manufacturing a CMOSFET according to the present invention.

Figure 1:
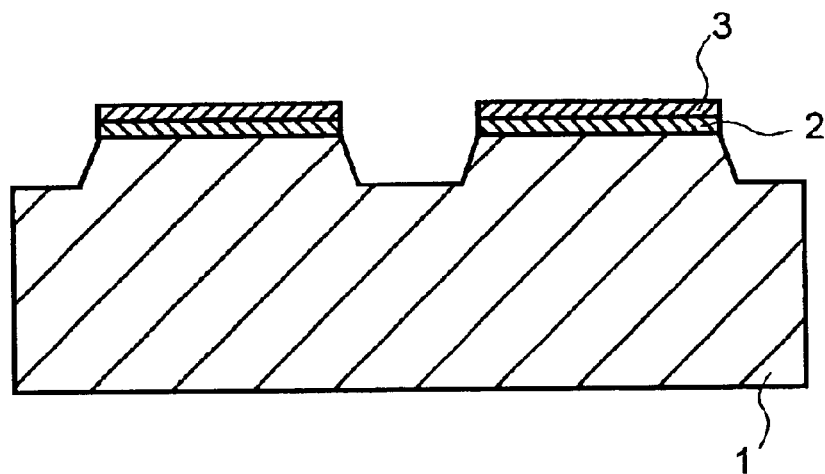
FIG. 1 is a sectional view of a CMOS transistor devices for describing one embodiment of the present invention.

In FIG. 1, firstly, a p-type silicon substrate 1 is thermally oxidized to form a silicon oxide film 2 of approximately 10 nm on the surface thereof. A silicon nitride film 3 is then deposited onto the silicon oxide film 2 by means of CVD (Chemical Vapour Deposition), whereupon the remaining area is covered by a resist mask, and the silicon nitride film 3, silicon oxide film 2 and silicon substrate 1 are dry-etched, thereby forming an element separating groove, as illustrated in FIG. 1.

Figure 2:
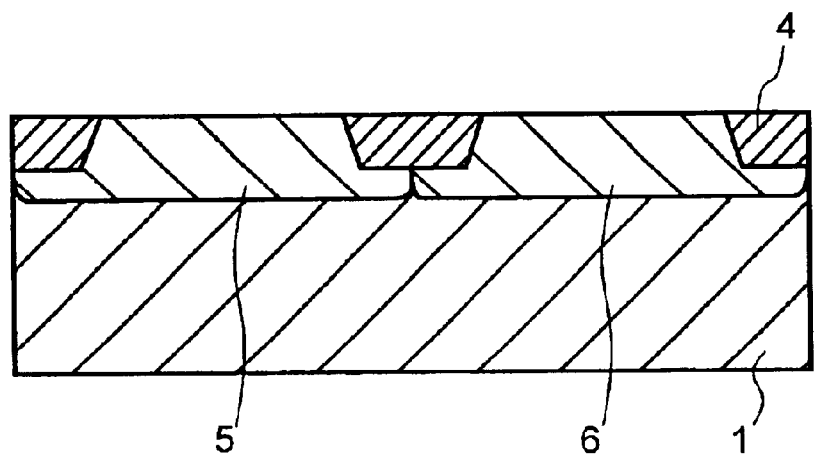
FIG. 2 is a sectional view of a CMOS transistor devices for describing one embodiment of the present invention.

Thereupon, the silicon nitride film 3 is removed by wet etching, and a silicon oxide film 4 is filled into the element separating groove by CVD. The silicon oxide film 4 that is deposited on top of the silicon substrate 1 is removed by an etch back process, thereby creating an element separating region wherein the silicon oxide film 4 only remains inside the element separating groove, as illustrated in FIG. 2. By annealing at approximately 1000° C., the silicon oxide film 4 formed into the element separating region is densified (baked).

Next, a p-type well 5 is formed by ion injection of boron into the n-channel type MISFET forming region at a dose of $2 \times 10^{13}$ cm$^{-2}$, and an n-channel well 6 is created by ion injection of phosphorous into the p-channel MISFET forming region at a dose of $3 \times 10^{13}$ cm$^{-2}$.

Figure 3:
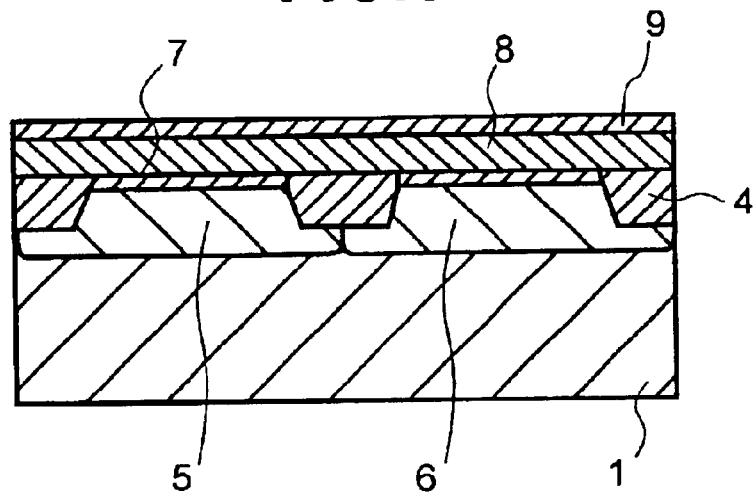
FIG. 3 is a sectional view of a CMOS transistor devices for describing one embodiment of the present invention.

Next, as shown in FIG. 3, the silicon substrate 1 is thermally oxidized to form a gate insulating film 7 of approximately 4 nm, this being a silicon oxide film formed on the surface of the p-type well 5 and the n-type well 6, whereupon a gate electrode film 8 containing polysilicon germanium is formed by CVD, and a silicon nitride film 9 is deposited thereon. The details of the method of forming the gate electrode film 8 are described hereinafter.

Figure 4:
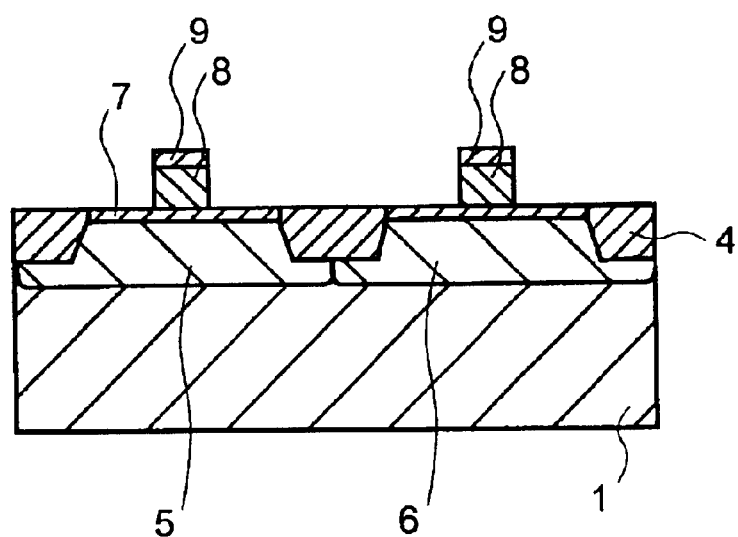
FIG. 4 is a sectional view of a CMOS transistor devices for describing one embodiment of the present invention.

Next, as shown in FIG. 4, a resist mask is placed over the structure, and the silicon nitride film 9 and gate electrode film 8 are dry etched to form a gate electrode.

Figure 5:
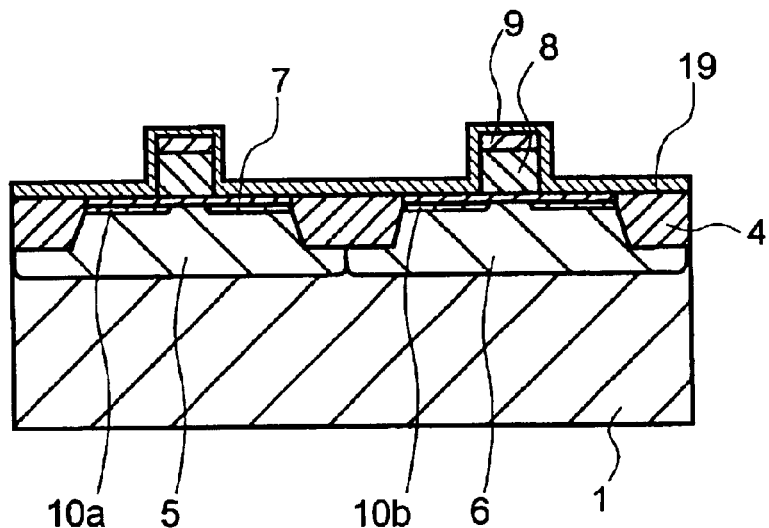
FIG. 5 is a sectional view of a CMOS transistor devices for describing one embodiment of the present invention.

Thereupon, as illustrated in FIG. 5, the n-type well 6 is covered with resist, and arsenic is ion injected into the p-type well 5, using the gate electrode in the n-channel type MISFET forming region as a mask, thereby creating a low-density n-type semiconductor region 10a. In a similar manner, the p-type well 5 is covered with resist, and boron is ion injected into the n-type well 6, using the gate electrode in the p-channel type MISFET forming region as a mask, thereby creating a low-density p-type semiconductor region 10b. Thereupon, a silicon oxide film 19 is formed by CVD on the gate electrode film 8 and silicon substrate 1.

Figure 6:
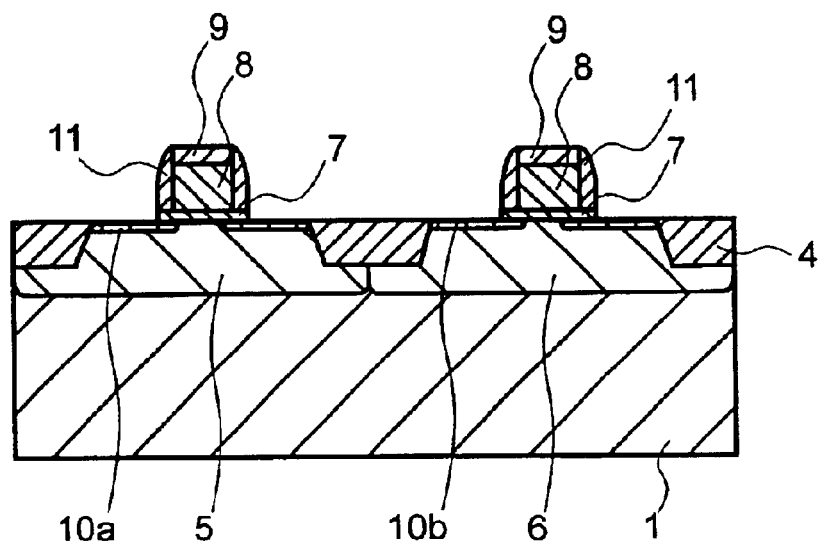
FIG. 6 is a sectional view of a CMOS transistor devices for describing one embodiment of the present invention.

By drying etching this film, a side wall spacer 11 is formed on the side of the gate electrode in the n-channel type MISFET forming region and on the side of the gate electrode in the p-channel type MISFET forming region, as illustrated in FIG. 6.

Figure 7:
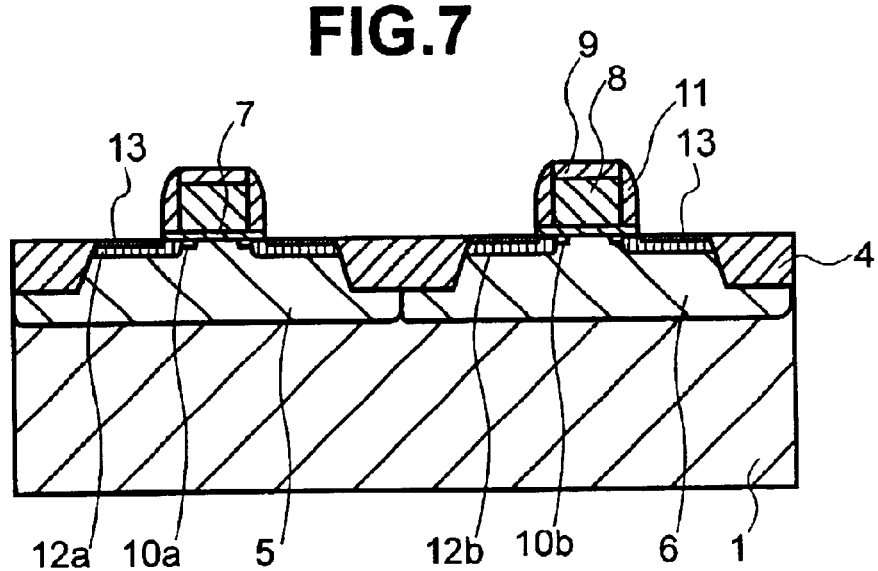
FIG. 7 is a sectional view of a CMOS transistor devices for describing one embodiment of the present invention.

Next, as shown in FIG. 7, the n-type well 6 is covered with resist, whereupon phosphorous is ion injected into the p-type well 5, using the gate electrode in the n-channel type MISFET forming region and the side wall spacer 11 as a mask, thereby forming a high-density n+ type semiconductor region 12a. Similarly, the p-type well 5 is covered with resist, whereupon boron is ion injected into the n-type well 6, using the gate electrode in the p-channel type MISFET forming region and the side wall spacer 11 as a mask, thereby forming a high-density p+ type semiconductor region 12b.

Thereupon, after depositing a titanium film by sputtering, heat treatment at approximately 700° C. is performed in a nitrogen atmosphere, thereby forming a titanium silicide film 13 on the surface of the n+ type semiconductor region 12a of the n-channel type MISFET forming region and the surface of the p+ type semiconductor region 12b of the p-channel type MISFET forming region. Thereupon, the titanium film which has not reacted is removed by wet etching.

Figure 8:
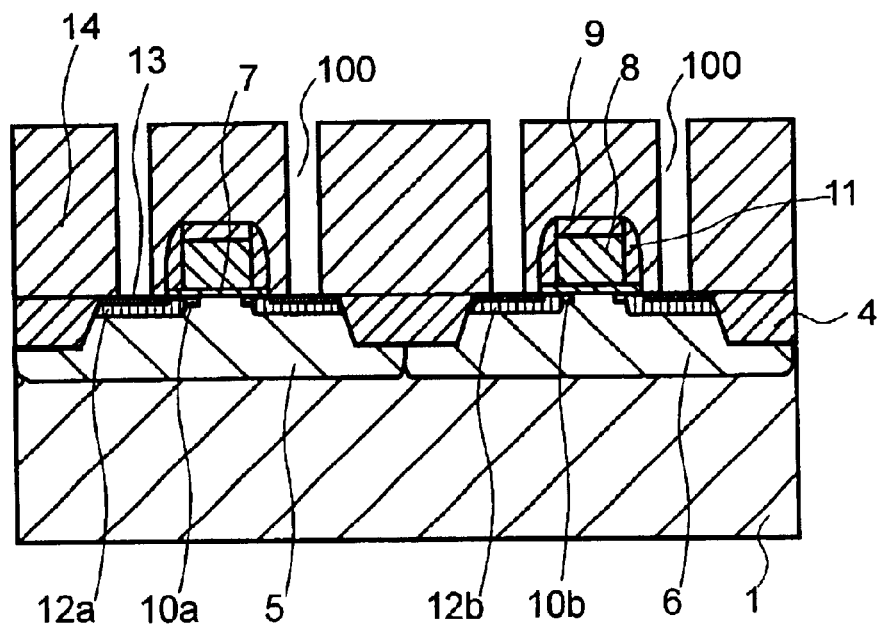
FIG. 8 is a sectional view of a CMOS transistor devices for describing one embodiment of the present invention.
Figure 9:
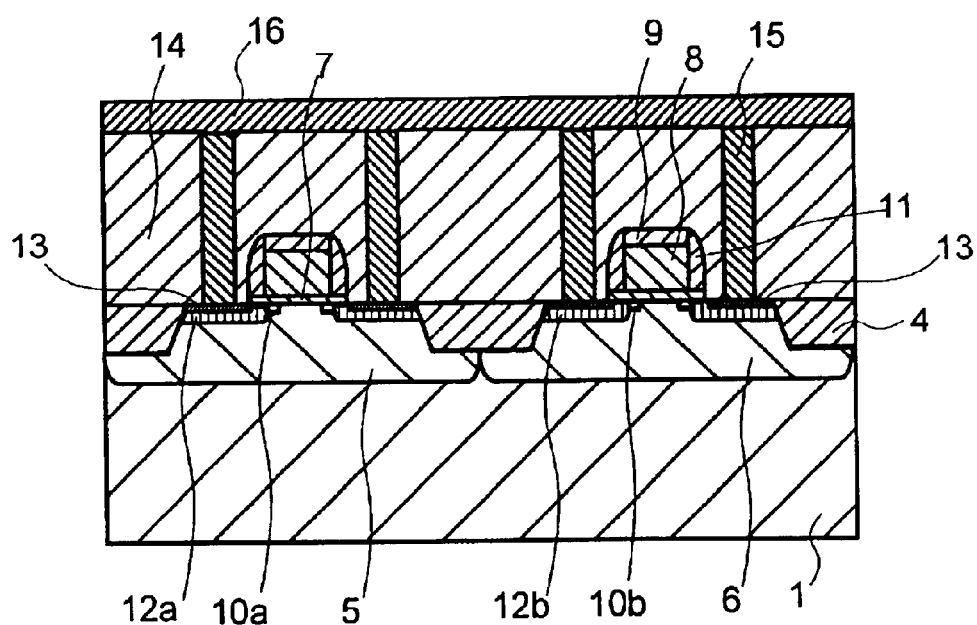
FIG. 9 is a sectional view of a CMOS transistor devices for describing one embodiment of the present invention.

Next, as illustrated in FIG. 8, an inter-layer insulating film 14 is formed, whereupon a resist mask is superposed and etching is performed, thereby opening contact holes 100 extending to the titanium silicide film 13 in the n+ type semiconductor region 10a of the n-channel type MISFET forming region and to the titanium silicide film 13 in the p+ type semiconductor region 10b of the p-channel type MISFET forming region. Thereupon, a tungsten film is filled into the contact holes to form plugs 15. The tungsten film is equalized by CMP, the tungsten film on the inter-layer insulating film 14 is removed, and a wiring layer 16 is formed, thereby completing a CMOSFET as illustrated in FIG. 9.

Next, a method of manufacturing the gate electrode film 8 is described in detail with reference to FIG. 10.

Figure 10:
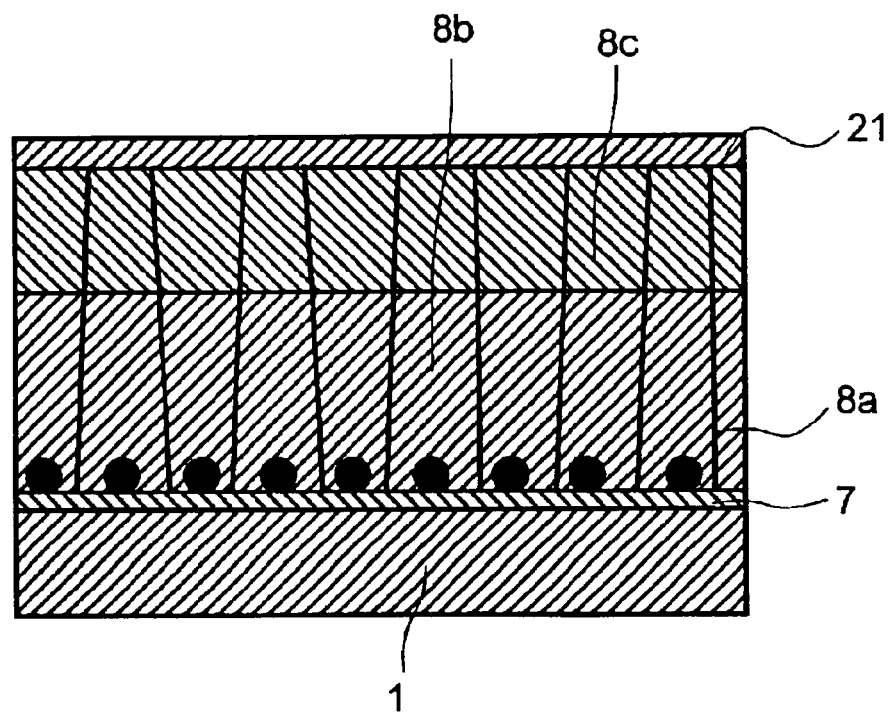
FIG. 10 is a sectional view showing one embodiment of a gate electrode of a CMOS transistor devices.

FIG. 10 is a sectional view showing one embodiment of a gate electrode of a CMOS transistor according to the present invention, and in the present embodiment, the gate electrode comprises a polysilicon germanium film.

In the diagram, the gate electrode film 8 is constituted by an island-shaped silicon film 8a, a polysilicon germanium film 8b, and a polysilicon film 8c. In this embodiment, a batch-type hot-wall CVD device is used to form the polysilicon germanium film 8b. Firstly, a silicon film 8a is formed in an island shape to a thickness of 4 nm on the silicon oxide film 7. Forming in an island shape means that the silicon film 8a is dotted onto the silicon oxide film 7 in isolated positions, or that there is a mixture of areas where silicon is present and areas where no silicon is present.

A polysilicon germanium film 8b is formed thereon to a thickness of 150 nm. Furthermore, a polysilicon film 8c is formed to a thickness of 50 nm. As described previously, B (boron) and P (phosphorous) are ion injected, and then annealing is performed to a temperature of 900° C. or above, in order to activate same. Moreover, although not illustrated in the drawings, a cobalt film 21 is formed by sputtering on the polysilicon film 8c, and silicide conversion is carried out by heat treatment at 700 to 900° C. The cap polysilicon film 8c, in other words, the protective polysilicon film 8c, is used to suppress increase in the interface resistance caused by reaction between the polysilicon germanium film 8b and the cobalt film 21.

SiH4 and GeH4 are used as source gases, and when forming the underlying silicon film, only SiH4 is supplied, whereas when forming the polysilicon germanium film, SiH4 and GeH4 are mixed and supplied. The underlying silicon film 8a, the polysilicon germanium film 8b, and the capping polysilicon film 8c are formed at the same temperature of between 530 and 650° C.

Figure 11:
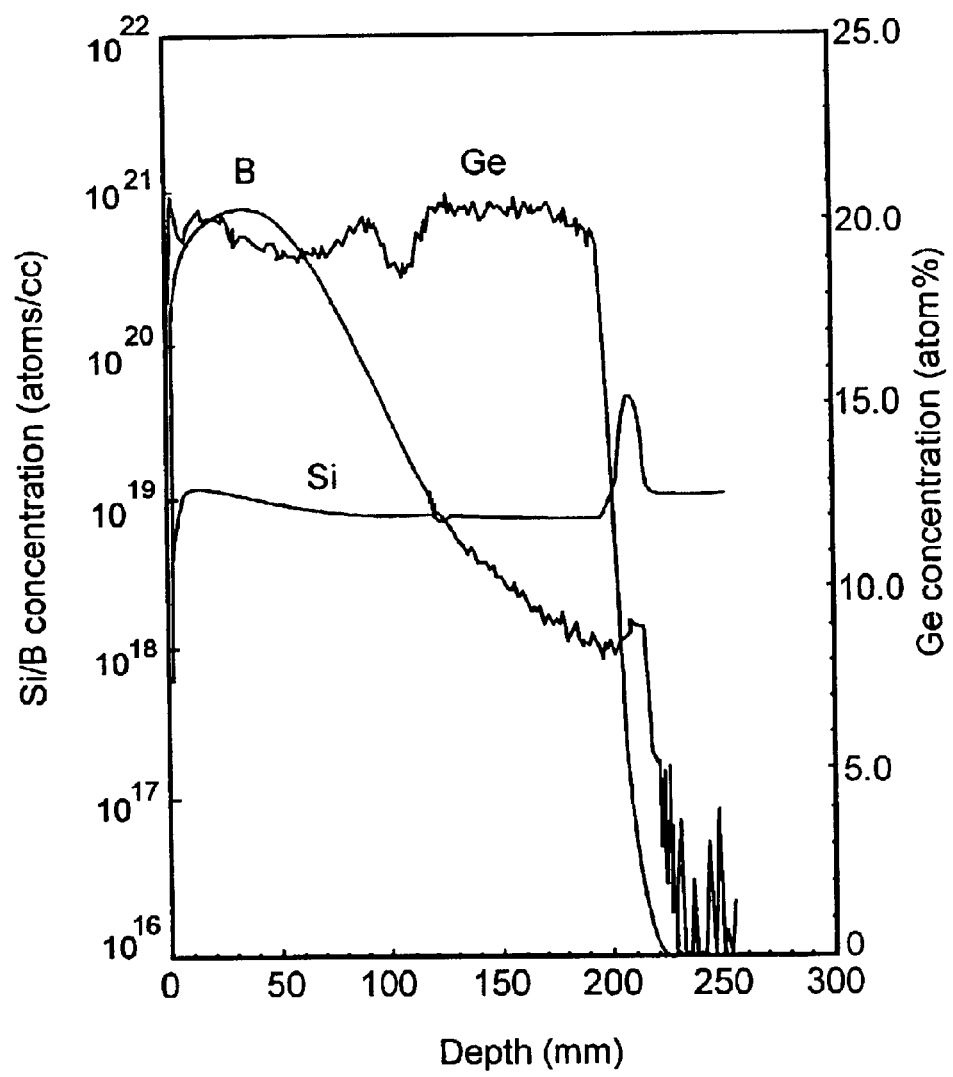
FIG. 11 is a graph showing the SIMS depth of a polysilicon germanium film in the present embodiment.

FIG. 11 is a graph showing the SMIS depth of the polysilicon germanium film according to the present embodiment, and it illustrates the SIMS depth profile of a B implantation annealed Ge 20% polysilicon germanium film formed at 600° C. The horizontal axis indicates depth (nm) and the vertical axis indicates the silicon and boron density (atoms/cc) and germanium concentration (atom %). In this diagram, the Ge concentration is uniform in the direction of the film thickness, and no decline in Ge concentration is observed at the interfaces. Therefore, it can be seen that even if the island-shaped silicon film 8a according to the present embodiment is used, there is no decline in boron concentration at the oxide film interface. This is a merit of using an island-shaped silicon film 8a and contrasts to the approximate 30% decline in Ge concentration which results at the oxide film interface when the 3 nm amorphous silicon film according to Ueshima et. al. is used. Since the coverage of the oxide film surface by the island-shaped silicon film 8a is low, the Ge concentration at the interface remains high and does not decline below 80%.

FIG. 12 shows sectional views of a gate electrode representing the diffusion of the Ge atoms in a case where the island-shaped silicon film is crystalline: FIG. 12(a) is a sectional view during formation of a crystalline silicon film; FIG. 12(b) is a sectional view during formation of a polysilicon germanium film; and FIG. 12(c) is a sectional view during implantation annealing. In this diagram, a silicon oxide film 7 is deposited onto a silicon substrate 1, and an island-shaped crystalline silicon film 8a is formed thereupon. The diagram indicates the spacing in the lattice of the island-shaped silicon film 8a. As shown in FIG. 12(a), firstly, island-shaped silicon crystals which do not contain any Ge atoms are formed. Thereupon, as shown in FIG. 12(b), a polysilicon germanium film 8b is grown, taking the silicon crystals as a nuclei. In FIG. 12(b), the horizontal lines in the polysilicon germanium film 8b indicate the approximate lattice spacing. In this case, the island-shaped silicon film 8a is crystalline, and the rate of diffusion of the Ge atoms at the film formation temperature is slow, meaning that the Ge diffusion is low. Thereupon, when implantation annealing is performed, as illustrated in FIG. 12(c), Ge atoms are diffused from the polysilicon germanium film 8b and the Ge concentration in the island-shaped silicon film 8a increases. In order to generate sufficient diffusion, the island-shaped silicon film 8a should be constituted by silicon micro-crystals having a size 10 nm or less. Incidentally, numeral 205 indicates an island-shaped silicon film containing Ge atoms.

FIG. 13 is a sectional view of a gate electrode indicating the diffusion of Ge atoms in a case where the island-shaped silicon film is amorphous silicon: FIG. 13(a) is a sectional view during formation of an amorphous silicon film; FIG. 13(b) is a section view during formation of a polysilicon germanium film; and FIG. 13(c) is a sectional view during implantation annealing. Firstly, as shown in FIG. 13(a), an island-shaped silicon film 8a of amorphous silicon, which does not contain Ge atoms, is formed. Thereupon, as illustrated in FIG. 13(b), a polysilicon germanium film 8b is grown in crystalline form on the surface of the amorphous island-shaped silicon film 8a. The amorphous island-shaped silicon film 8a also undergoes crystal growth when the polysilicon germanium crystals are formed. In this case, crystal growth occurs whilst the Ge atoms are diffused from the polysilicon germanium film 8b into the amorphous island-shaped silicon film 8a. Moreover, as shown in FIG. 13(c), due to the implantation annealing treatment, Ge atoms are diffused from the polysilicon germanium film 8b and the Ge concentration of the crystallized island-shaped amorphous silicon film 7 increases.

Regardless of whether the island-shaped silicon film 8a is crystalline or amorphous, in either case, diffusion of Ge atoms occurs during implantation annealing, but the Ge concentration at the interface with the oxide film becomes higher in the case of amorphous silicon. Although it is possible to produce sufficient diffusion of Ge atoms when using crystalline silicon by lengthening the annealing time, this is not desirable due to the problem of shifting in the threshold value (Vth) due to changes in the impurity profile of the MOS diffusion layer and run-off of boron (B) into the gate oxide film. In the case of crystalline silicon, micro-crystals into which the Ge atoms are able to diffuse should be used. If micro-crystals are used, then diffusion is speeded up and distortion of the surrounding Si—Ge lattice is reduced.

Figure 14:
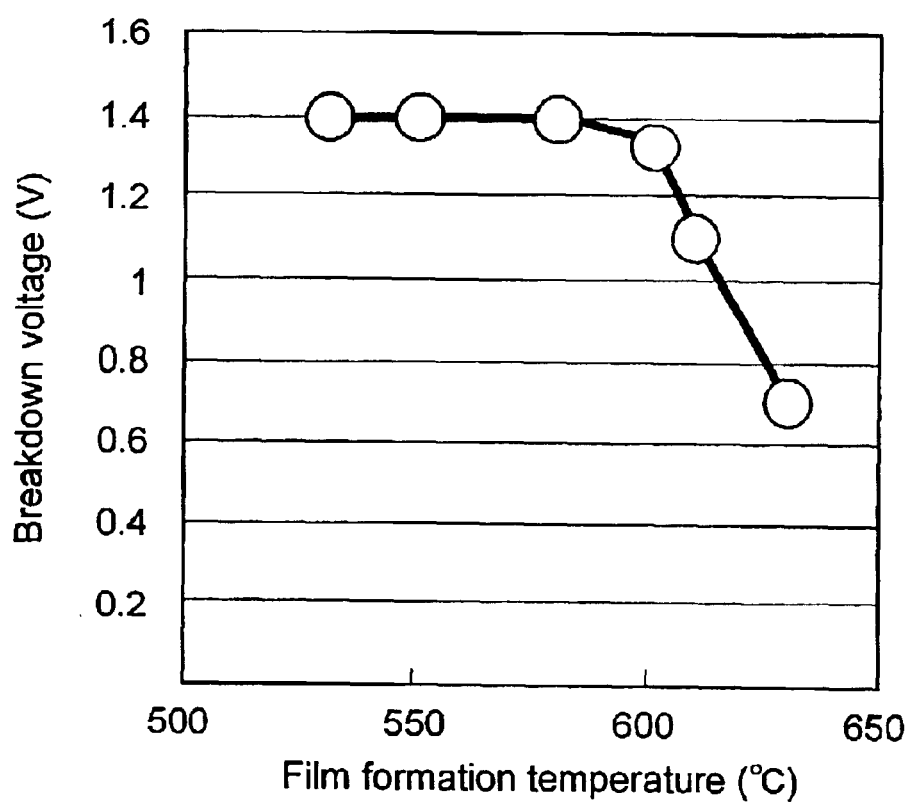
FIG. 14 is a graph showing the relationship between the breakdown voltage of a gate oxide film and the film formation temperature of a polysilicon germanium film.

FIG. 14 is a graph showing the relationship between the breakdown voltage of the gate oxide film and the formation temperature of the polysilicon germanium film. The horizontal axis indicates the polysilicon germanium film formation temperature (° C.) and the vertical axis indicates the breakdown voltage (V) of the gate oxide film. As this diagram demonstrates, the breakdown voltage of the gate oxide film declines, the higher the film formation temperature. Thus, the breakdown voltage of the gate oxide film shows temperature dependence. The film formation temperature of the island-shaped silicon film varies in the same fashion as that of the polysilicon germanium film.

FIG. 15 shows AFM images illustrating the surface shapes of polysilicon germanium films formed at different temperatures. FIG. 15(a) shows surface shape when the film is formed at 640° C., FIG. 15(b) shows the surface shape when the film is formed at 610° C., and FIG. 15(c) shows the surface shape when the film is formed at 580° C.

As shown in FIG. 15(a) to FIG. 15(c), the AFM images of the polysilicon germanium film surfaces formed at 640, 610 and 580° C. reveal that the grain size increases, the higher the film formation temperature.

Next, in order to investigate the effects of the surface shape of the polysilicon germanium film on the gate breakdown voltage, the gate breakdown voltage was evaluated whilst maintaining the film formation pressure for the island-shaped silicon film 8a at a uniform 60 Pa, and varying the film formation pressure for the polysilicon germanium film 8b.

Figure 16:
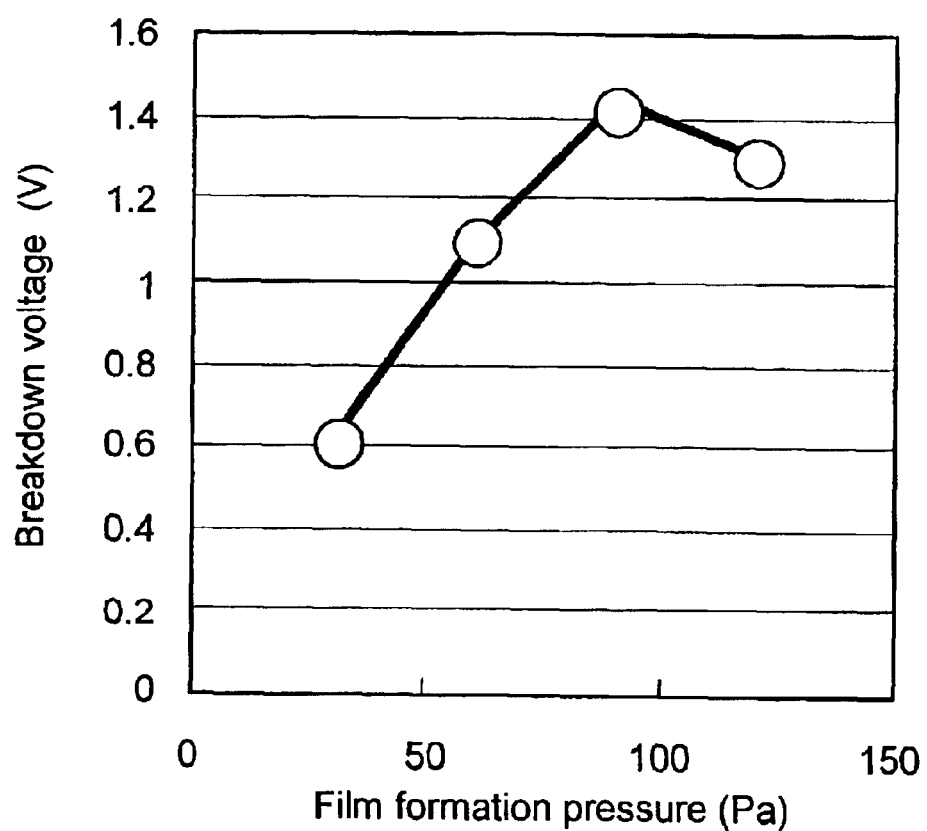
FIG. 16 is a graph showing the relationship between the breakdown voltage of a gate oxide film and the film formation pressure of a polysilicon germanium film.

FIG. 16 is a graph showing the relationship between the breakdown voltage of the gate oxide film and pressure at which the polysilicon germanium film is formed, wherein pressure (Pa) is represented on the horizontal axis, and the gate oxide film breakdown voltage (V) is represented on the vertical axis. As shown in FIG. 16, the higher the film forming pressure, the higher the breakdown voltage.

FIG. 17 shows the surface shapes of polysilicon germanium films formed at different pressures: FIG. 17(a) to FIG. 17(c) are AFM images of the surface shape of a film formed at 60 Pa, 90 Pa and 120 Pa. The AFM images of the surfaces of the formed polysilicon germanium films reveal that the grain size decreases, the higher the film formation pressure.

Consequently, it can be seen that the breakdown voltage increases, the smaller the grain size at the surface of the polysilicon germanium film. From the AFM results, it can be seen that in a polysilicon germanium film of 150 nm, a satisfactory gate breakdown voltage is obtained if the maximum grain size at the surface of the polysilicon germanium film is 75 nm or less, in other words, half the film thickness or less.

Next, in order to investigate the causes of deterioration in the breakdown voltage of the polysilicon germanium film 8b, the polysilicon film 8c and the polysilicon germanium film 8b were evaluated by X-ray diffraction (XRD).

Figure 18:
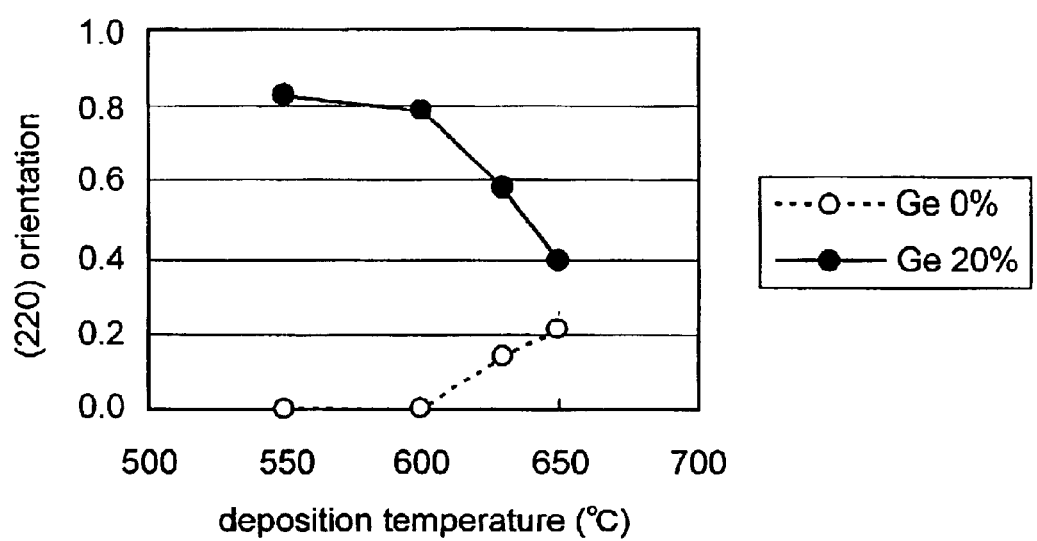
FIG. 18 is a graph showing the temperature dependence of the (220) orientation.

FIG. 18 is a graph showing the temperature dependence of the (220) orientation, which illustrates the film formation temperature dependence of the (220) orientation of the polysilicon film 8c and the polysilicon germanium film 8b. The horizontal axis indicates the film formation temperature (° C.) and the vertical axis indicates the volume distribution of the (220) orientation. As shown in the diagram, it can be seen that the (220) orientation of the polysilicon germanium film 8b is high compared to that of the polysilicon film 8c. At 600° C. or below, the orientation is extremely high at 60% or above, and at 650° C. or above, the orientation declines to 50% or below.

Since the (220) orientation is strong, the (220) diffraction peak of the polysilicon film 8c and the polysilicon germanium 8b was evaluated in detail. For XRD measurement, 0.1 mm was used on both the incident side and the emission side of a condensing optics system.

FIG. 19 is a graph based on X-ray diffraction of a polysilicon and polysilicon germanium film, wherein the horizontal axis indicates the diffraction angle and the vertical axis indicates X-ray intensity. As shown in FIG. 19(b), in the polysilicon germanium film 8b, the width broadens on the higher angle side of the (220) peak, forming an asymmetrical shape. On the other hand, as illustrated in FIG. 19(a), no asymmetry of this kind is observed in the polysilicon film 8c. Furthermore, this asymmetry is not seen in the (111) and (311) peaks, either. The curved dotted line in FIG. 19(a) and FIG. 19(b) indicates calculated values.

Thereupon, a method for quantifying the asymmetry of the diffraction peak in X-ray diffraction is described with reference to FIG. 20.

Figure 20:
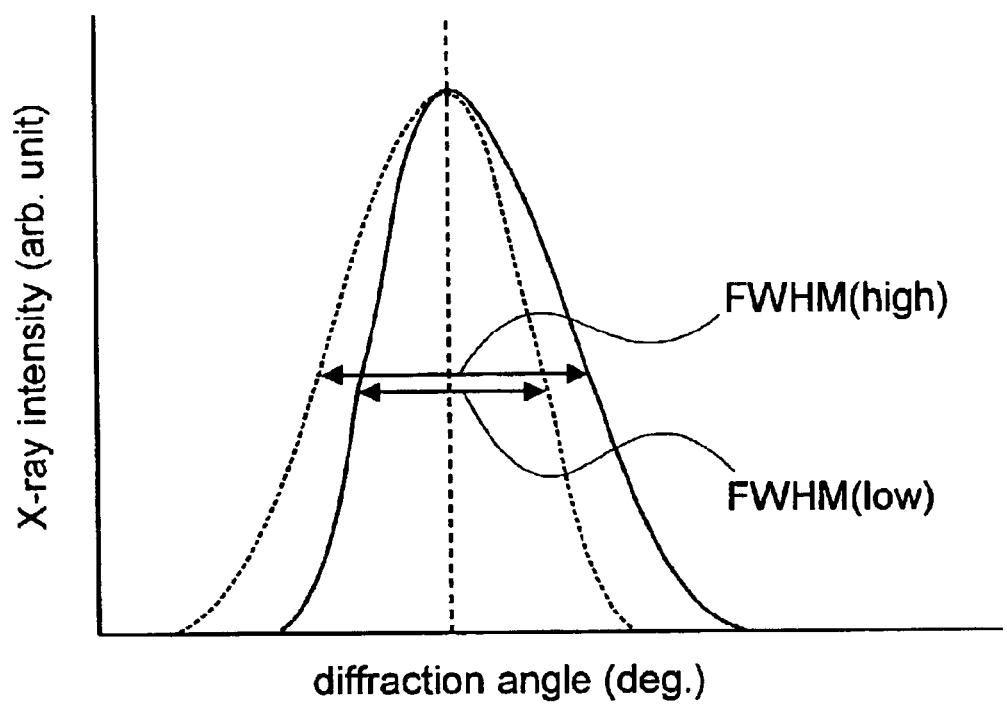
FIG. 20 is a characteristics graph for defining the asymmetry of the (220) diffraction peak.

FIG. 20 is a graph for defining the (220) diffraction peak asymmetry, wherein the horizontal axis indicates the diffraction angle and the vertical axis indicates X-ray intensity. As shown in FIG. 20, the respective curves are fitted by means of a Gaussian curve on the high angle side and low angle side of the peak, and the full-width at half-maximum FWHM (high) on the high angle side of the peak and the full-width at half-maximum FWHM (low) on the low angle side of the peak are derived. The asymmetry is defined as a value obtained by normalizing the difference ΔFWHM between the full-width at half-maximum FWHM (high) on the high angle side of the peak and the full-width at half-maximum FWHM (low) on the low angle side of the peak, by the total full-width at half-maximum.

In other words, it is defined as ΔFWHM={FWHM(high)−FWHM(low)}/{FWHM(high)/2+FWHM(low)/2}.

Figure 21:
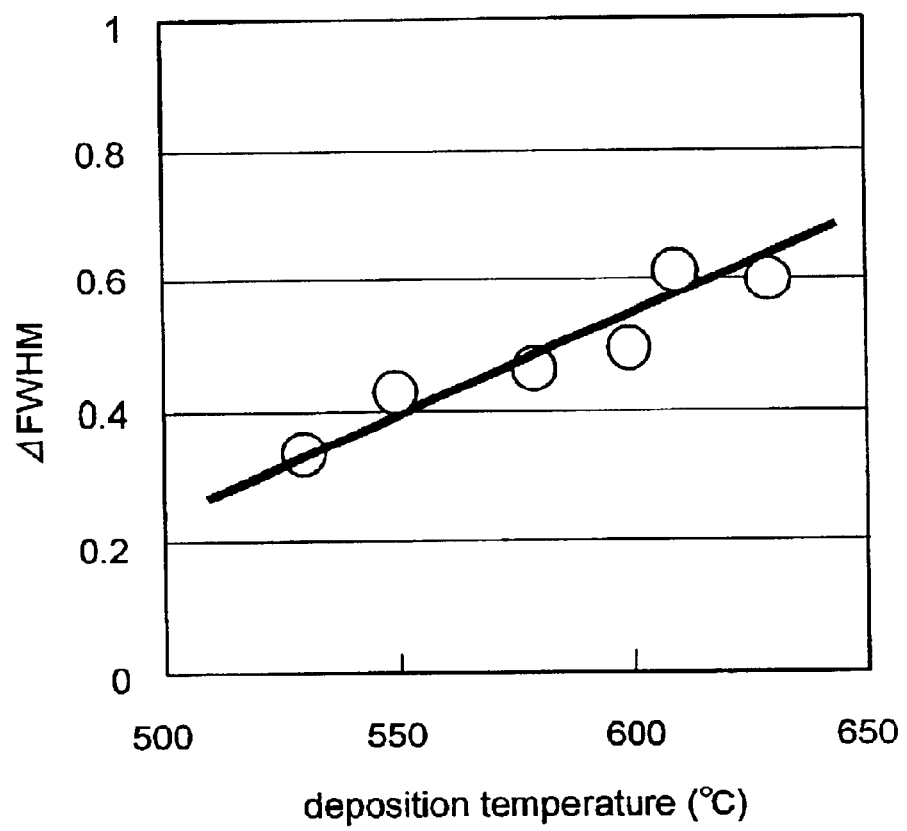
FIG. 21 is a graph showing the dependence of the asymmetry of the (220) diffraction peak on the film formation temperature.

FIG. 21 is a graph of the film formation temperature dependence of the asymmetry of the (220) diffraction peak, showing the film formation temperature dependence of the asymmetry of the (220) diffraction peak of a Ge 20% polysilicon germanium film. In the diagram, the horizontal axis represents the film formation temperature (° C.) and the vertical axis represents the differential ΔFWHM. As shown in FIG. 21, it can be seen that the asymmetry increases, the higher the film formation temperature. This is because the stress of the crystals in the polysilicon germanium film 8b increases as the film formation temperature increases.

Figure 22:
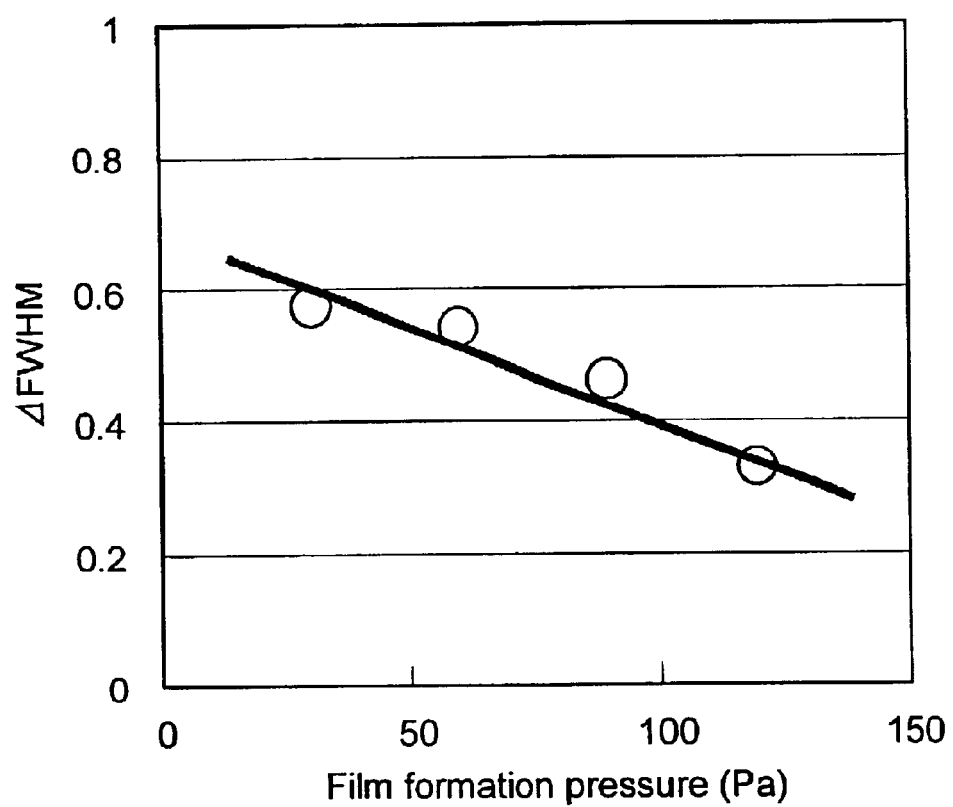
FIG. 22 is a graph showing the dependence of the asymmetry of the (220) diffraction peak on the film formation pressure.

FIG. 22 is a graph of the film formation pressure dependence of the (220) diffraction peak asymmetry, which illustrates the dependence of the (220) diffraction peak asymmetry on the film formation pressure for a Ge 20% polysilicon germanium film. The horizontal axis represents pressure (Pa) and the vertical axis represents the differential ΔFWHM. As the diagram clearly reveals, the asymmetry declines, the greater the film formation pressure.

Figure 23:
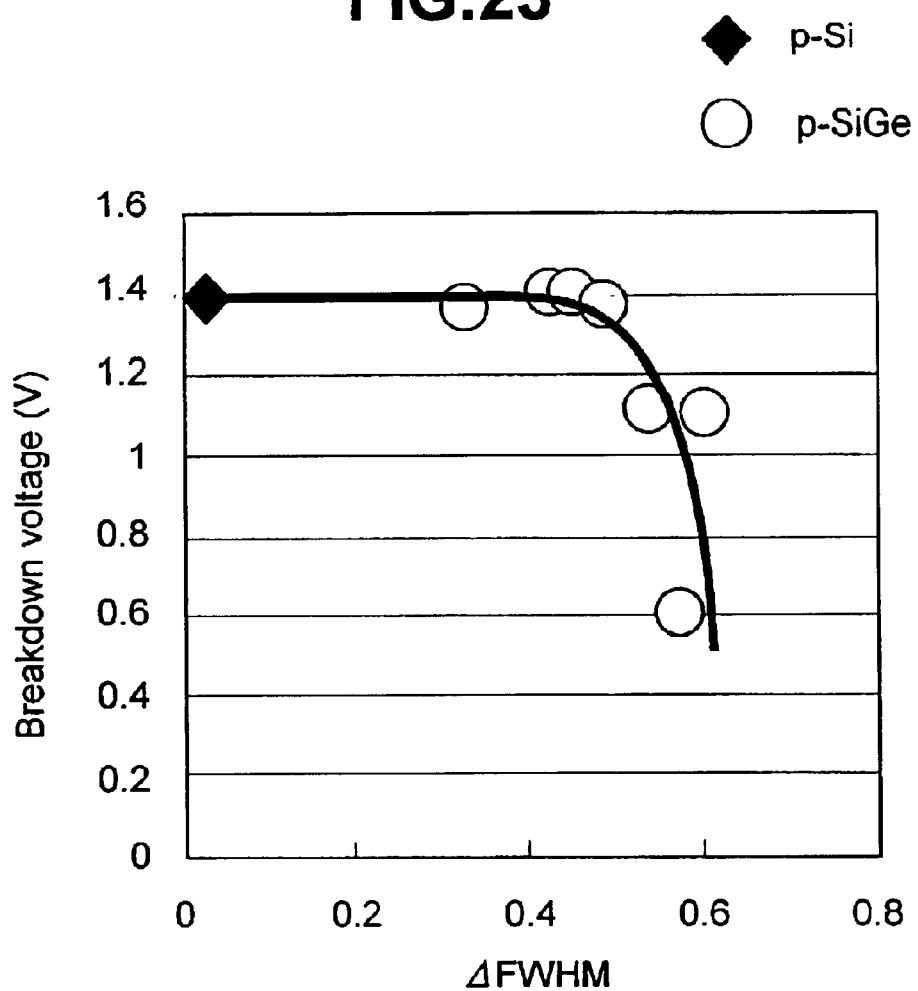
FIG. 23 is a correlation chart showing the relationship between the asymmetry of the (220) diffraction peak and the breakdown voltage of the gate oxide film.

FIG. 23 is a correlation graph showing the relationship between the (220) diffraction peak asymmetry and the breakdown voltage of the gate oxide film, wherein the horizontal axis represents the differential FWHM and the vertical axis represents the gate oxide film breakdown voltage (V). As the diagram reveals, asymmetry is observed, in other words, the degradation of the gate oxide film breakdown voltage increases, the greater the value of ΔFWHM. At an asymmetry factor of 0.4 or less, the breakdown voltage is satisfactory, being equivalent to that of the polysilicon film 8c. The variation in the gate breakdown voltage can be explained when it is taken into account that the (220) asymmetry is produced by distortion at the oxide film interface and stress between the crystal particles.

The delay time for formation of the polysilicon germanium film 8b onto the oxide film is long, as if it is formed directly thereon, enlargement of the crystal grains occurs, and the breakdown voltage declines markedly. Therefore, it is essential to adopt a process for previously forming a silicon film to provide growth seed crystals. However, in the case of polysilicon germanium, there is a large difference in the lattice spacing, and hence a great amount of lattice distortion is generated at the oxide film interface when the polysilicon germanium crystals are grown.

Below, the aspects of the initial growth of the polysilicon germanium film are described with reference to FIG. 24.

FIG. 24 gives sectional views of a gate electrode for describing distortion in the initial growth of the polysilicon germanium film. As shown in FIG. 24(a), firstly, a silicon oxide film 7 is deposited onto a silicon substrate 1, and when an island-shaped silicon film 8a is formed thereon, an island-shaped silicon film 8c, which is an underlying film, is grown in an island shape, in an isolated fashion. The horizontal lines in the island-shaped silicon film 8a indicate the lattice spacing.

Here, when the polysilicon germanium film 8b is deposited, as shown in FIG. 24(b), the polysilicon germanium film 8b grows horizontally from the underlying silicon film (silicon oxide film) 7. In this case, if the underlying silicon film 7 is crystalline, then the polysilicon germanium film 8b will be subjected to a compressive distortion in the direction of the film thickness, due to the difference in the lattice spacing. The horizontal lines in the polysilicon germanium film 8b indicate the lattice spacing and they demonstrate the compressive distortion generated. Thereupon, as shown in FIG. 24(c), the polysilicon germanium film 8b proceeds to grow in a vertical direction, whilst being subjected to this distortion.

It is thought that the broadening of the full-width at half-maximum observed on the higher angle side of the (220) peak in XRD is due to the compressive distortion remaining in the film thickness direction. In the sectional views in FIG. 24, the initial growth of the silicon germanium film 8b is depicted as changing from horizontal growth to vertical growth, but in fact, these growths occur simultaneously, although needless to say, the growth in the horizontal direction is greater in magnitude.

The reliability of the gate oxide film (silicon oxide film) 7 is a product of the distortion generated during initial growth, and the stress between the polysilicon germanium grains grown subsequently. In other words, suppressing lattice distortion and stress in the polysilicon germanium crystal grains is essential to improving the reliability of the gate insulating film.

There exists the following method for reducing lattice distortion in the polysilicon germanium crystals.

After forming an island-shaped underlying silicon film at a formation temperature of 500–580° C., a silicon germanium film is formed. The underlying silicon film is formed using SiH4 only, whereas the silicon germanium film is grown using a mixed gas of SiH4 and GeH4, the two films being formed in a consecutive fashion, by switching the gas supply only, without changing the temperature. At a film formation temperature at or below 580° C., the underlying silicon film does not crystallize and is amorphous, whereas the polysilicon germanium film having a low melting point crystallizes. At 600° C. or above, the underlying silicon film crystallizes (having a lattice spacing proximate to a crystalline structure), and the polysilicon germanium film grown thereon experiences a large amount of stress. At 580° C. or below, the underlying silicon film is amorphous when it is formed, and it undergoes solid-state growth when the polysilicon germanium film is formed. This growth of the underlying silicon film occurs simultaneously with the growth of the polysilicon germanium film, and therefore the lattice distortion does not become very large.

By means of this method, since the underlying silicon film crystallizes after formation of the gate electrode film, diffusion of B and P is not liable to occur during implantation annealing. Therefore, it is necessary to keep the grain size at the polysilicon germanium film interface to 30 nm or less. In order to keep the grain size at the polysilicon germanium film interface to 30 nm or less, the film formation pressure for the underlying silicon film is raised to increase the density of nucleus generation.

Next, the reasons for the decline in the breakdown voltage of the gate oxide film are described with reference to FIG. 25.

FIG. 25 provides model diagrams showing lattice distortion of polysilicon germanium film crystals at the interface with the oxide film: FIG. 25(a) is a model diagram of a case where the particle size of the island-shaped silicon is 20 nm or above; FIG. 25(b) is a model diagram of a case where the particle size of the silicon micro-crystals is 10 nm or below. In these diagram, 301 is a region of low concentration of Ge atoms, and 302 is a region of high concentration of Ge atoms. As shown in FIG. 11, after implantation annealing of B and P, the Ge diffuses from the polysilicon germanium into the underlying silicon film 7. However, since the diffusion rate of the Ge into the crystalline silicon is slow, the Ge concentration therein is low, namely, 80% or lower, compared to the polysilicon germanium film 8b.

In this case, as shown in FIG. 25(a), if the particle size of the island-shaped silicon film 8a is 20 nm or above, then the lattice distortion will be concentrated in the region of low Ge concentration 301, and therefore the reliability of the gate insulating film will decline. However, if crystalline silicon of particle size 10 nm or less is used for the underlying silicon film 7, then sufficient diffusion of Ge will occur, and as illustrated in FIG. 25(b), the Ge concentration in the vicinity of the interface will be over 80%, thereby making it possible to reduce the lattice distortion in the silicon germanium film at its interface with the oxide film. Moreover, in order to increase the Ge concentration at the oxide film interface, the gate oxide film surface coverage rate of the island-shaped silicon film should be kept to 20% or below.

Below, a method for fabricating a polycrystalline gate electrode film 8 using a single wafer type cold wall CVD device, is described. SiH4 and GeH4 are used as source gases, SiH4 only being supplied when forming the underlying silicon film, and a mixture of SiH4 and GeH4 being supplied when forming the polysilicon germanium film, the mixture ratio thereof being adjusted in such a manner that the Ge concentration of the silicon germanium film is 20%.

In a single wafer type CVD device, it is necessary to use a film formation temperature of 600° C. or above, in order to obtain high through-put compared to a batch method. However, similarly to the embodiment illustrated in FIG. 10, at 600° C. or above, the stress in the polysilicon germanium film 8b becomes large and the reliability of the gate insulating film declines.

The following method exists for reducing the stress in the polysilicon germanium crystal particles, whilst maintaining a quick polysilicon germanium film formation rate.

The single wafer apparatus used in the present embodiment has a plurality of film forming chambers and annealing devices, whereby laminated film formation and annealing processing at different temperature conditions can be performed in continuous fashion. Moreover, since a cold well chamber is used, a device providing simple gas atmosphere and pressure control can be employed.

In a first method, the film formation pressure for the polysilicon germanium film 8b is raised in order to increase the nucleus formation concentration on the underlying silicon film. By so doing, the grain size of the polysilicon germanium film 8b is reduced, and the stress of the crystal grains is reduced, thereby yielding high voltage tolerance. The stress in the film depends on the grain size in the film surface containing the capping polysilicon film, and the thicker the film, the greater the grain size. In order to reduce the stress, the maximum crystal grain size should be kept at or below one half of the total thickness of the polysilicon germanium film and the capping polysilicon film. For example, if the polysilicon germanium film is 100 nm and the capping polysilicon germanium film sis 50 nm, then the maximum grain size at the surface will be 75 nm or less, which is satisfactory.

A second method is now described with reference to FIG. 26.

Figure 26:
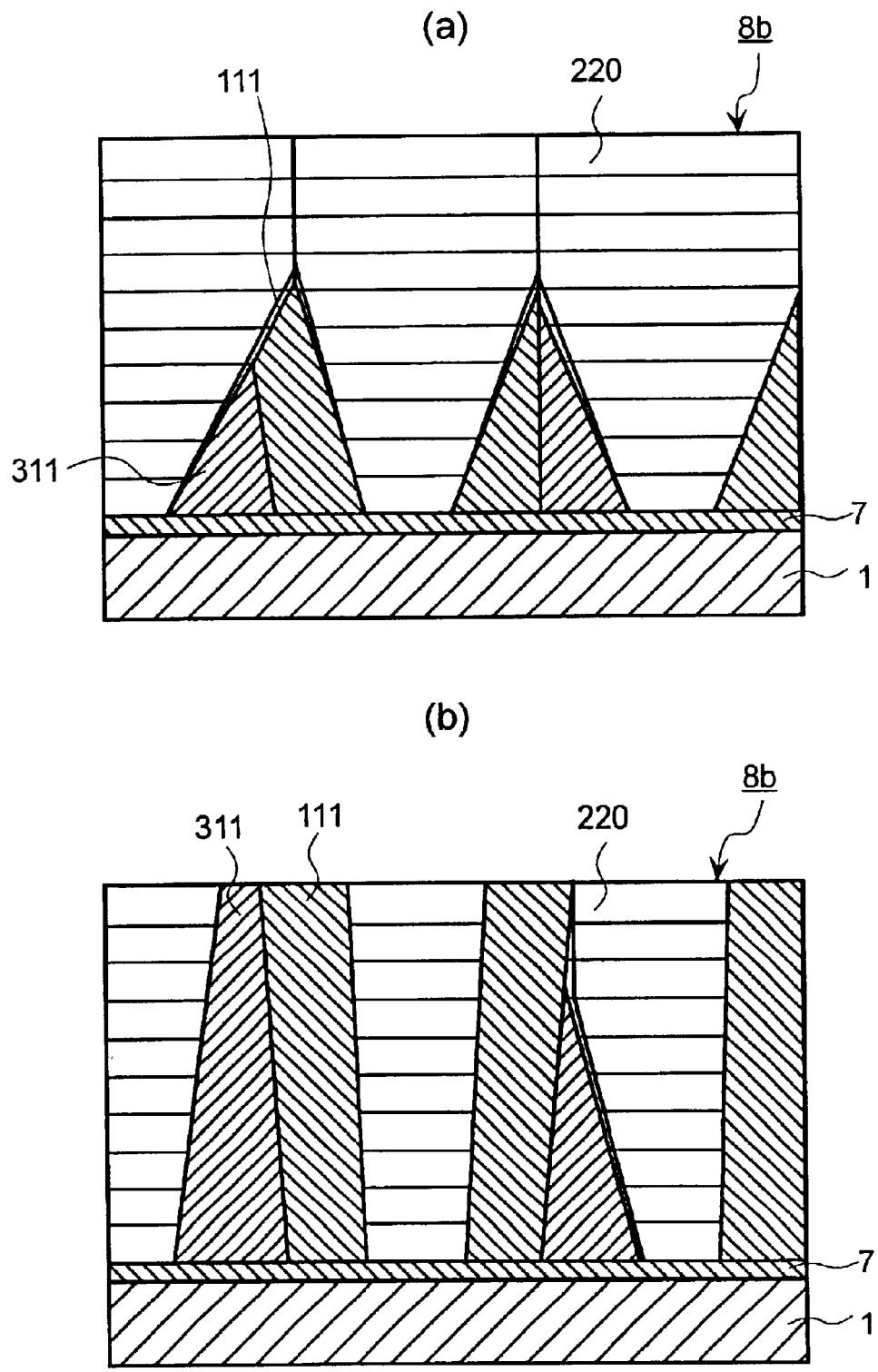
FIG. 26 is a sectional view of a gate electrode.

FIG. 26 is a sectional view of a gate electrode; FIG. 26(a) is a sectional view of a case where the (220) orientation of the polysilicon germanium film is high, and FIG. 26(b) is a sectional view of a case where the (220) orientation of the polysilicon germanium film is low. In these diagrams, 311 is a crystal having (311) orientation and 111 is a crystal having (111) orientation.

After forming an underlying silicon film 7 and annealing at 800° C. or above, a polysilicon germanium film 8b is formed. As illustrated in FIG. 26a, if the (220) orientation of the polysilicon germanium film 8b is high, then a large amount of stress is generated at the grain boundaries, but as illustrated in FIG. 26(b), a polysilicon germanium film 8b having a low (220) orientation has a dense composition and the stress therein is reduced. Annealing improves the crystallinity of the underlying silicon film 7 having incomplete crystallanity, and the orientation of the polysilicon germanium film 8b grown thereupon follows that of the underlying silicon film 7, the (220) orientation being 50% or less. By reducing the (220) orientation, the crystal grains are caused to combine together tightly, thereby reducing the stress.

A third method is described with reference to FIG. 27 and FIG. 28.

FIG. 27 shows AFM images illustrating the surface shapes of polysilicon germanium films having different film formation thickness: FIG. 27(a) is a diagram showing the surface shape in a case where the polysilicon germanium film is 100 nm thick; and FIG. 27(b) is a diagram showing the surface shape in a case where the polysilicon germanium film is 200 nm thick.

Figure 28:
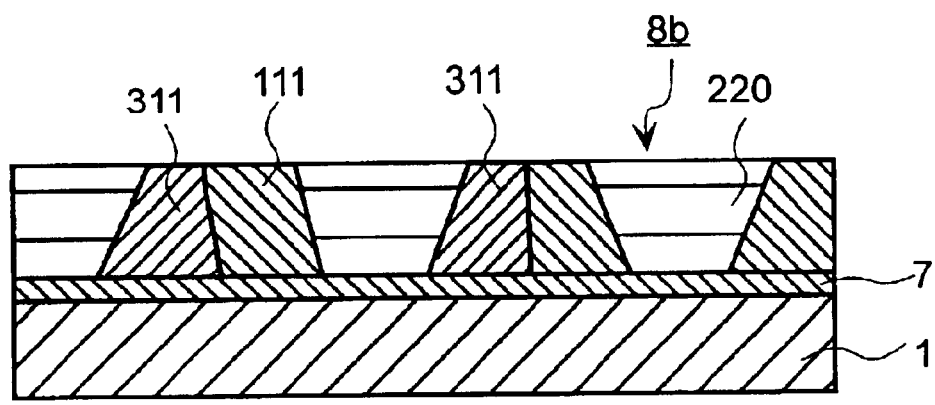
FIG. 28 is a sectional view of a polysilicon germanium film having a thickness of 30 nm or less.

FIG. 28 is a sectional view of a polysilicon germanium film having a thickness of 30 nm or less.

By comparing the cases where the thickness of the polysilicon germanium film is 100 nm and 200 nm, respectively, it can be seen that the grain size at the surface of the polysilicon germanium film decreases, the thinner the film, as demonstrated by FIG. 27(a) and FIG. 27(b). In order to suppress depletion at the interface, the polysilicon germanium film 8b should only be provided in the vicinity of the interface, and it is possible to reduce the resistance of the gate electrode sufficiently by forming a polysilicon film 8c of 70 nm or more on this film.

Consequently, in the third method, the thickness of the polysilicon germanium film is set to 30 nm or less. If the thickness of the polysilicon germanium film is set to 30 nm or less, then the film is dense, as illustrated in FIG. 28, and the grain size is small, thereby reducing the overall stress on the grains, and making it possible to suppress deterioration of properties of the gate insulating film. In element 8 in the diagram, the horizontally lined region of the polysilicon germanium film 8b is the region of (220) orientation, 311 is the region of (311) orientation, and 111 is the region of (111) orientation.

In a fourth method, an underlying silicon film and a polysilicon germanium film of 20 nm or less are formed at a low temperature of 600° C. or below, whereupon a polysilicon germanium film of 30 nm or greater and a capping polysilicon film are formed thereon at a high temperature of 650–750° C. The underlying silicon film is amorphous when it is formed at low temperature, but at the film formation temperature for the polysilicon germanium film, it crystallizes. Therefore, it is possible to reduce the stress at the oxide film interface by performing both the formation of the underlying silicon film and the initial growth of the polysilicon germanium film at a low temperature.

In the present embodiment, a MOS transistor formed on a silicon substrate is used, but the present invention may also be used similarly in a MOS transistor on a silicon film, such as an SOI (Silicon on Insulator), or a thin-film transistor on a glass substrate.

(Second Embodiment)

There follows a description of a method of manufacturing a CMOSFET using a fine polysilicon germanium film by supplying crystalline silicon fine particles according to the present invention. The methods for forming element separating grooves and wells are the same as those in the first embodiment, and hence they are omitted here and a detailed description of the polysilicon germanium film formation process is given.

In order to describe the benefits of the present invention, a comparison is made with the sequence for polysilicon germanium film formation based on supply of silicon fine particles according the first embodiment.

Figure 29:
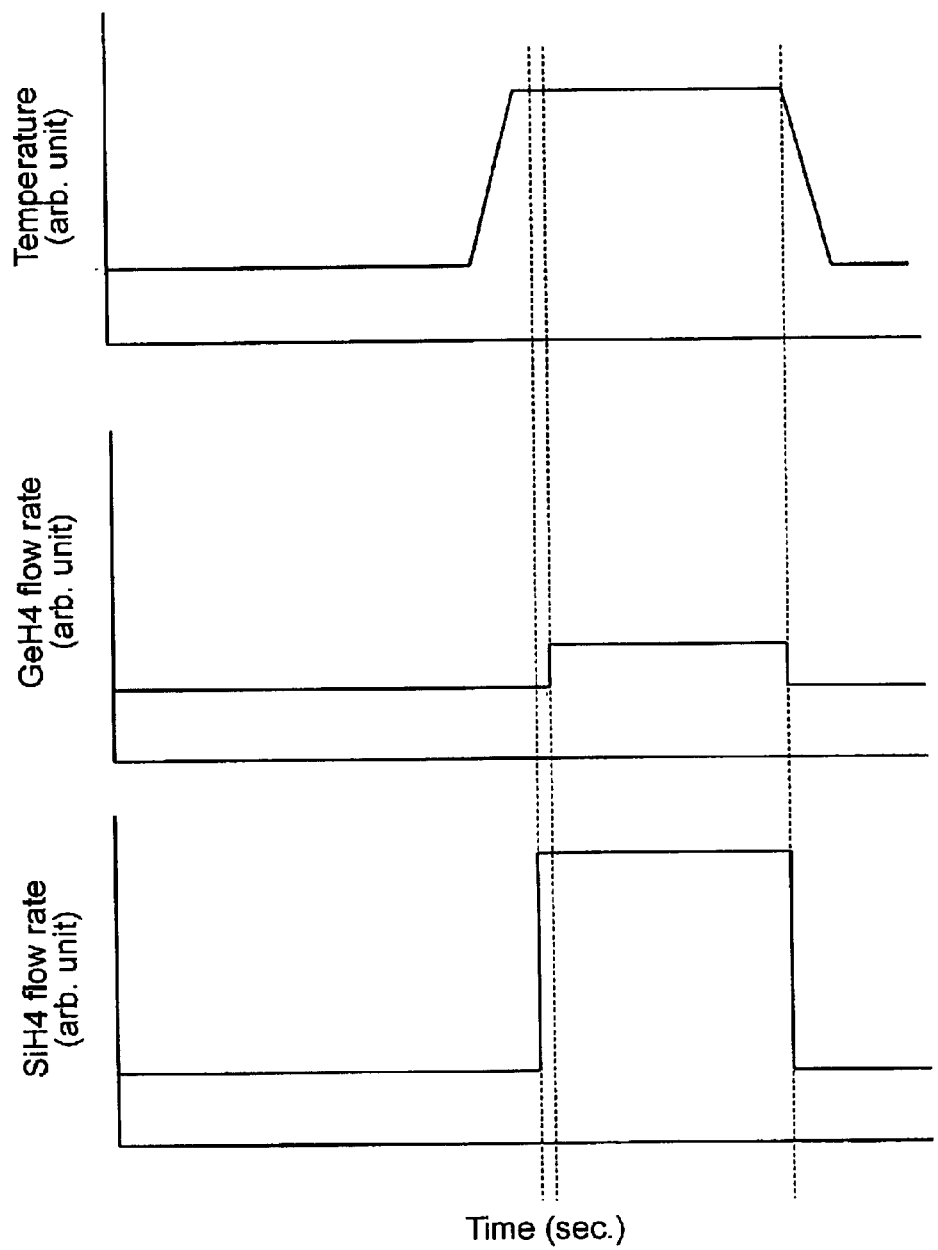
FIG. 29 is a timing chart of gas introduction for forming silicon fine particles and a silicon germanium film according to the present invention.

FIG. 29 shows a gas flow for CVD film formation according to the first embodiment. After heating a wafer to a film formation temperature of 500–800° C., the temperature is held at a uniform value for approximately 10 seconds, and then SiH4 gas is introduced into the film formation chamber. When a silicon film of approximately 3–10 nm has been formed, GeH4 gas is introduced in such a manner that the Ge composition in the polysilicon germanium film will be 10–30%. A polysilicon germanium film is formed to a thickness of approximately 100–150 nm. The process of forming the polysilicon germanium film by supplying silicon fine particles is illustrated in FIG. 30. FIG. 30(a) illustrates a state after formation of silicon fine particles; FIG. 30(b) illustrates a state during forming of the polysilicon germanium film; and FIG. 30(c) illustrates a state after formation of the polysilicon germanium film. Under these film formation conditions, normally, a crystalline film is created, but since the fine particles have a large surface area, the crystallization temperature is high and hence the film is either amorphous, or in a state of very low crystallization (FIG. 30(a)). Therefore, if film growth is continued, the fine particles will combine with each other to form larger silicon particles. Eventually, when the particle size reaches 20 nm or greater, crystallization will occur, and therefore the crystal size in the vicinity of the interface will not be 20 nm or less, as illustrated in FIG. 30(c).

Figure 31:
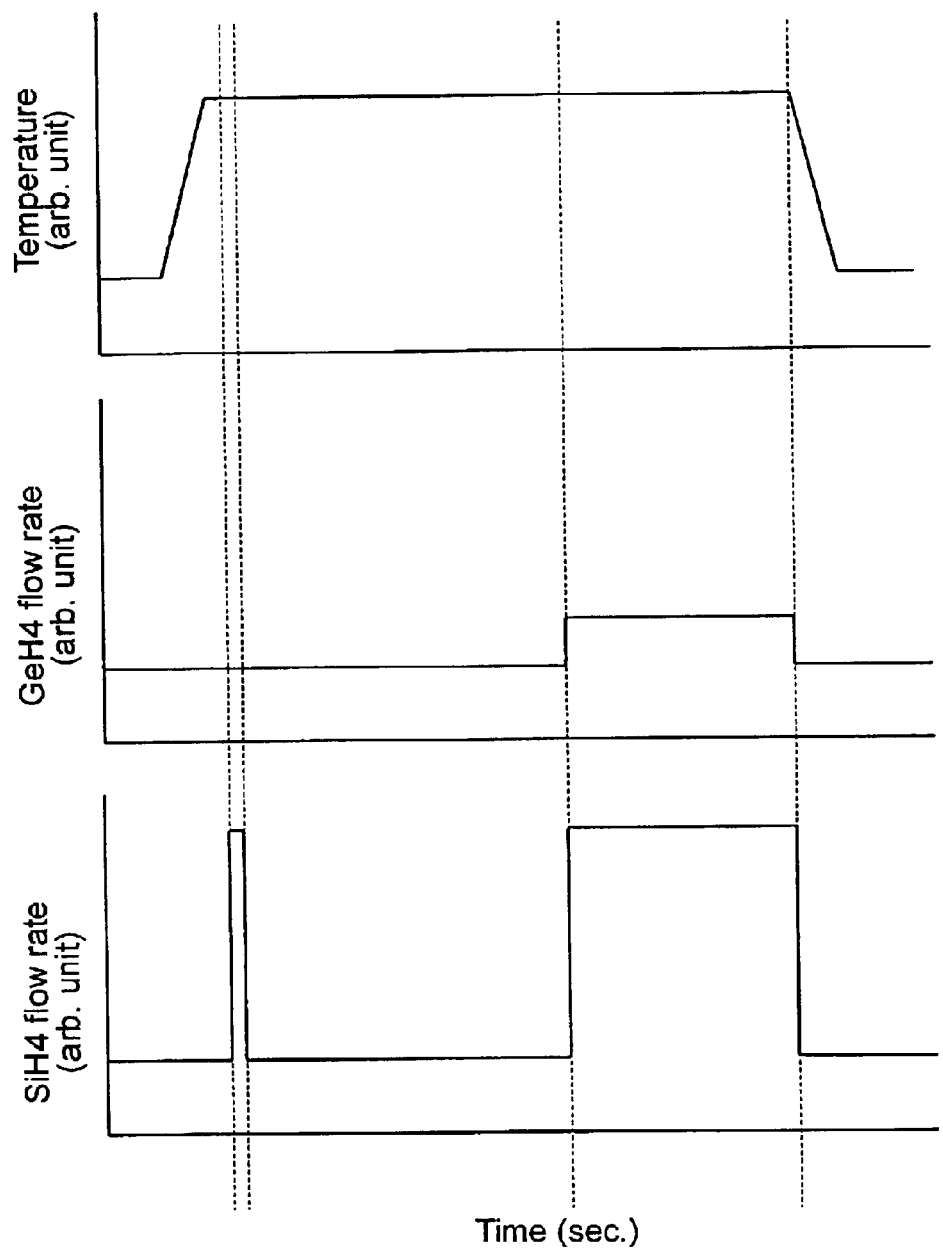
FIG. 31 is a timing chart of gas introduction for forming crystalline silicon fine particles and a silicon germanium film according to the present invention.
Figure 32:
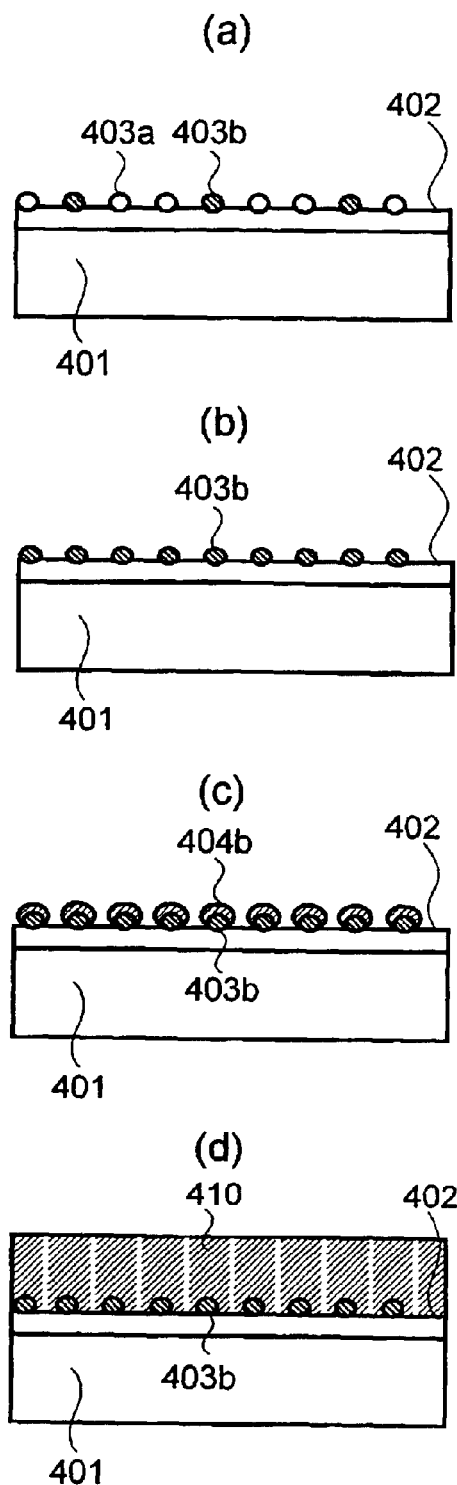
FIG. 32 is a flowchart of a fine grain silicon germanium film forming processing by means of forming crystalline silicon fine particles according to the present invention.

On the other hand, in the present embodiment, after forming a polysilicon film to approximately 3 nm, as illustrated in FIG. 31, the supply of SiH4 gas is halted for a prescribed time period, and the SiH4 gas and GeH4 gas is supplied after the silicon fine particles has crystallized to a sufficient degree. More specifically, after forming a silicon film to 10 nm on the oxide film at 500–800° C., the supply of SiH4 is halted, crystallized fine particles are allowed to grow for a period of 5 minutes, and the SiH4 and GeH4 gas is then supplied in order to form a silicon germanium film of 100–150 nm. FIG. 32 illustrates the polysilicon germanium film forming process according to the present embodiment. FIG. 32(a) shows a state after formation of silicon fine particles; FIG. 32(b) shows a state after crystallization annealing; FIG. 32(c) shows a state during formation of the silicon germanium film; and FIG. 32(d) shows a state after polysilicon germanium film formation. By optimising the film formation temperature and pressure, the nucleus density of silicon fine particles, a mixture of 403a and 403b, is raised to $10^{11}/cm^2$ or above.

Therefore, in the present invention, crystallization is performed in a fine particlestate to form crystalline fine particles 403b, in such a manner that the density of crystal particles and the density of grains in the vicinity of the interface are equal. In other words, after forming the fine particles 403a, heat treatment is performed at a temperature and for a time which produces crystallization, without causing diffusion of the fine particles 403a, and a silicon germanium film 410 is then grown in crystal form, using the crystallized fine particles 403b as nuclei, thereby making it possible to reduce the grain size in the vicinity of the interface with the oxide film, whilst also achieving uniform grain size (FIG. 32(d)). If the size of the fine particles is too small, then crystallization is not liable to occur, whereas if they are too big, they tend to combine with neighbouring particles, and therefore a particle size of approximately 5–10 nm is desirable. If the silicon germanium is used for the fine particles, then the nucleus formation density on the oxide film will be small, and hence it is desirable that the fine particles are of silicon.

Figure 33:
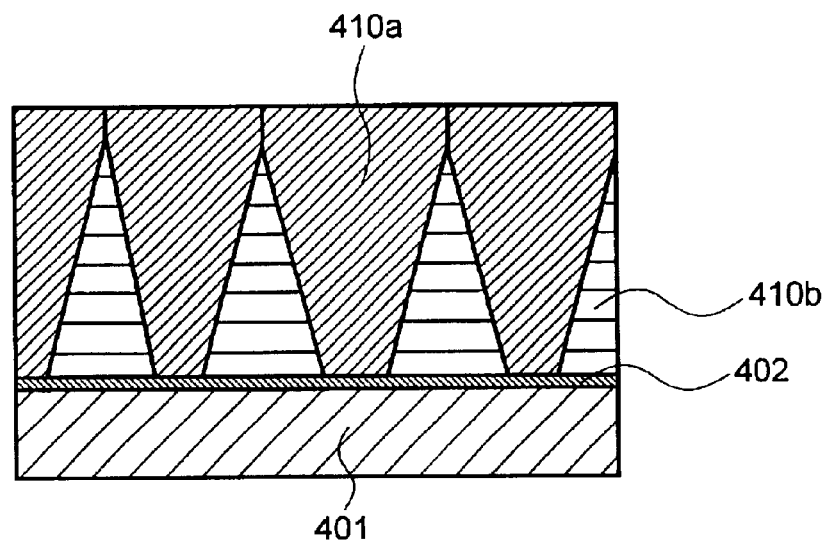
FIG. 33 is a schematic view of the sectional structure of a silicon germanium film formed by means of forming underlying silicon layer.
Figure 34:
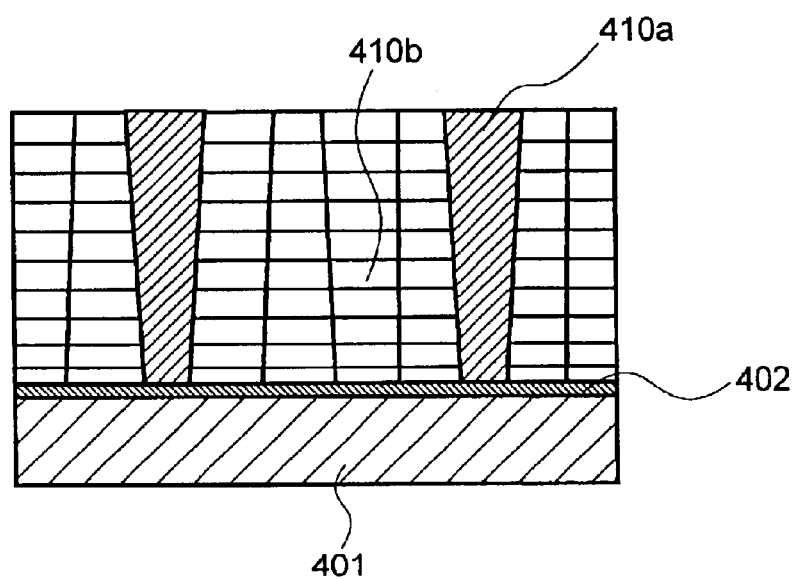
FIG. 34 is a schematic view of the sectional structure of a silicon germanium film formed by supplying crystalline silicon fine particles according to the present invention.

As described with respect to the first embodiment, in a conventional polysilicon germanium film, the grain size is increased by the high (220) orientation (FIG. 33). As shown in FIG. 34, since (220)-oriented grains are scarce in the initial stages of growth, it is possible to form a film with low (220) orientation if crystallization is performed using the fine particles, and coarsening of the fine particles does not occur.

Figure 35:
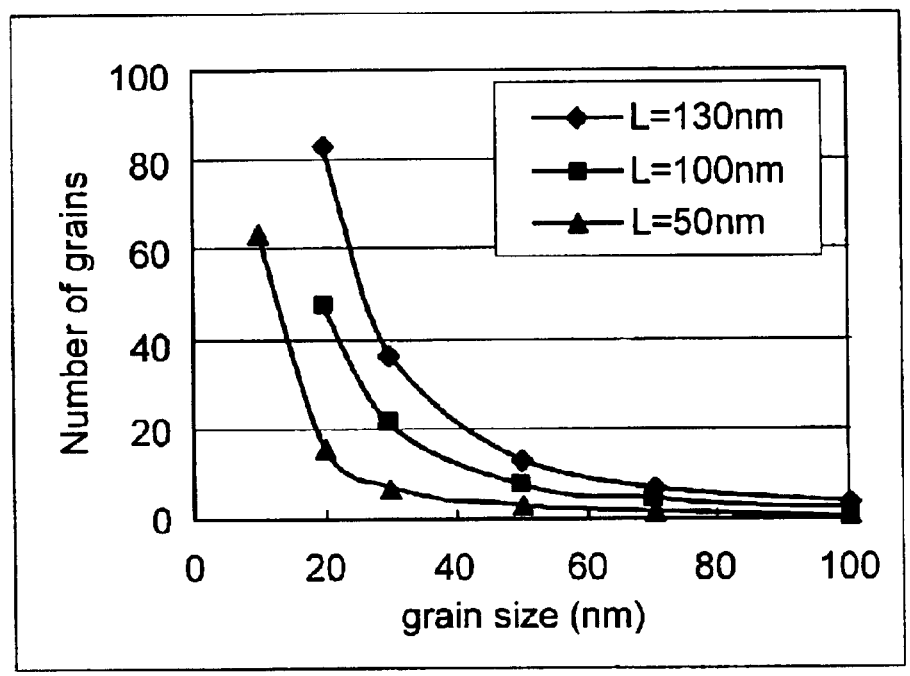
FIG. 35 shows the relationship between the grain size of the gate electrode film and the number of grains present in one gate.

FIG. 35 shows the relationship between grain size and the number of grains in a gate electrode film, for respective gate lengths. The higher the number of grains, the smaller the variation in transistor characteristics, and if it is assumed that the leakage increases by one decimal place for each crystal grain, then 20 grains or more are required in order to keep the leakage increase for one gate to 5% or less. In other words, at a gate length of 130 nm, the grain size must be kept to 40 nm or less, at a gate length of 100 nm, to 30 nm or less, and at a gate length of 50 nm, to 20 nm or less. The polysilicon germanium film is required at gate lengths of 100 nm or less, and hence the average grain size thereof must be kept to 30 nm or less.

Moreover, in order to prevent local increases in leakage current, variation in grain size must be reduced, in addition to the average grain size. In a conventional method, crystalline film formation occurs in an irregular way, and hence the grain size cannot be made uniform. However, in the present embodiment, since the crystalline fine particles are formed to a uniform size, the grain size of the polysilicon germanium film is uniform, accordingly, and therefore the average grain size can be kept to 30 nm or less whilst also restricting the variation in grain size (relative standard deviation) to 40% or lower.

Figure 36:
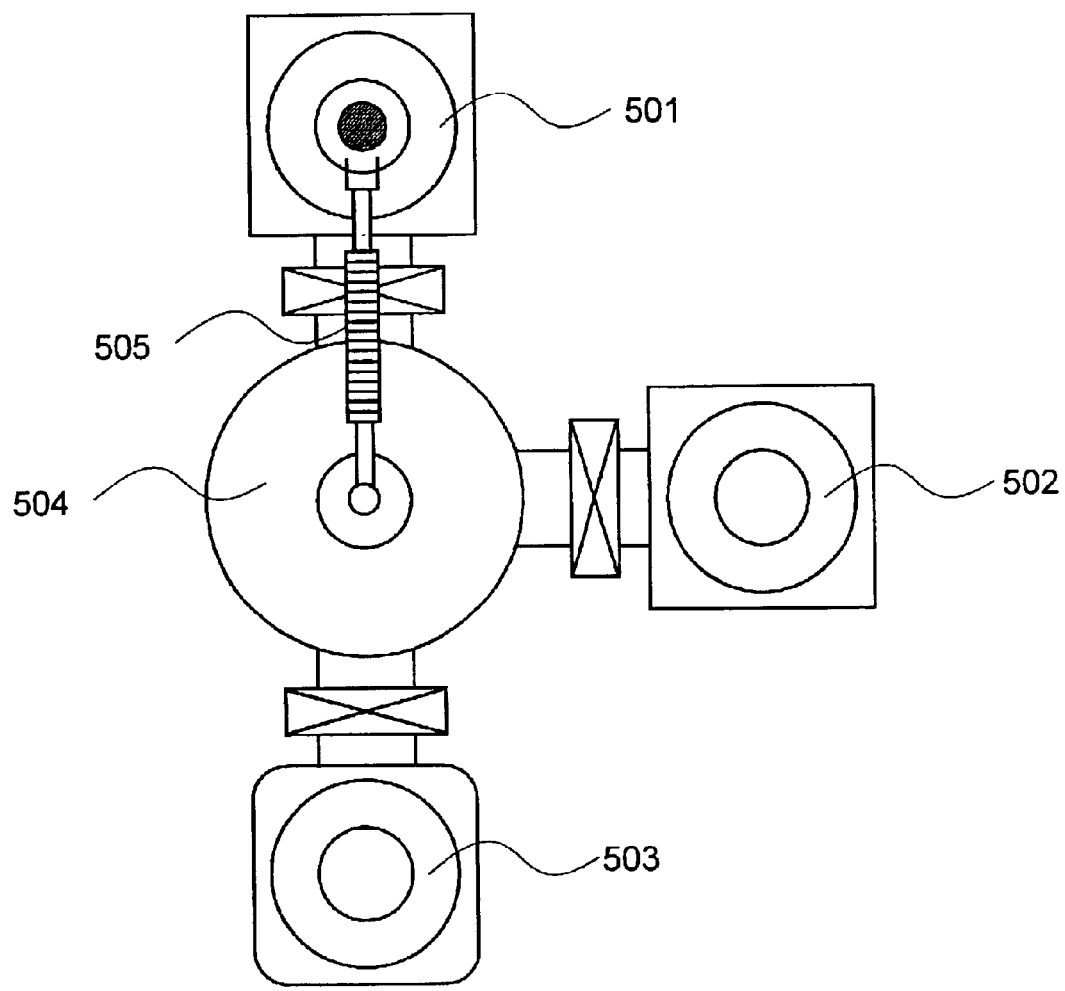
FIG. 36 is a schematic view of a cluster tool using the present invention.

In the method for creating crystalline silicon fine particles, it is even more effective if heat treatment at a temperature higher than the film formation temperature is used in order to stimulate crystallization, rather than simply maintaining the film formation temperature. In the present embodiment, a cluster tool is used wherein a film forming chamber 501 and a high-temperature annealing chamber 502 are connected in a vacuum state, as illustrated in FIG. 36.

After forming a silicon film 403a to approximately 3 nm on an oxide film at a temperature of 500–800° C. in the film forming chamber 501, the piece is moved by an arm 505 of a transportation chamber 504 to an annealing chamber 502, where it is heated by lamp annealing to a temperature of 800–1200° C. for between 10 seconds and 3 minutes. The piece is returned to the film forming chamber 501, where a polysilicon germanium film 410 of 100–150 nm is formed.

The film forming conditions may be the same as those for forming the fine particles, but it is preferable to use higher temperature and higher pressure conditions to achieve a higher film formation rate. Normally, if the film formation temperature is raised, then the interface grain size increases, but in the present application, the grain size is determined by the initial fine density, so film formation at high temperature does not alter the grain size, and hence high-temperature film formation is beneficial in terms of through-put. Alternatively, the crystallization annealing may be performed in a separate heat treatment apparatus, after forming a silicon film 403a to approximately 3 nm on the oxide film, at a temperature of 500–800° C.

Figure 37:
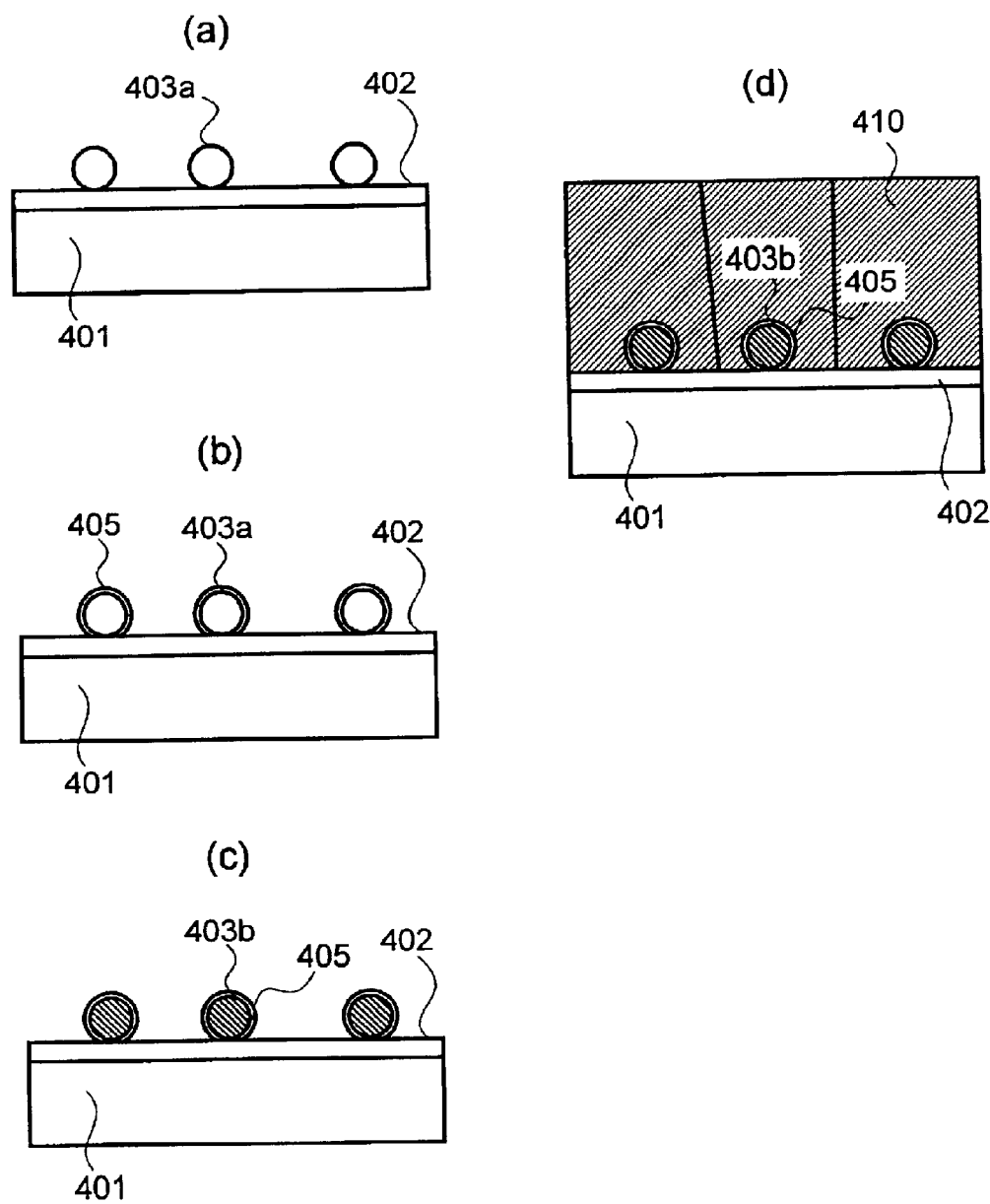
FIG. 37 is a flowchart of a fine grain silicon germanium film forming process which includes a surface modification processing step after forming silicon micro-crystals according to the present invention.

Furthermore, in the heat treatment during crystallization, in order to prevent agglomeration caused by the silicon film 403a diffusing into the surface of the oxide film, a surface modification layer 405 should be formed at low temperature by means of oxygen or a halogen gas, as illustrated in FIG. 37, before the temperature is raised. Annealing may also be performed after forming a surface modification layer 405 by introducing a flow of oxygen or a halogen gas whilst raising the temperature.

Figure 38:
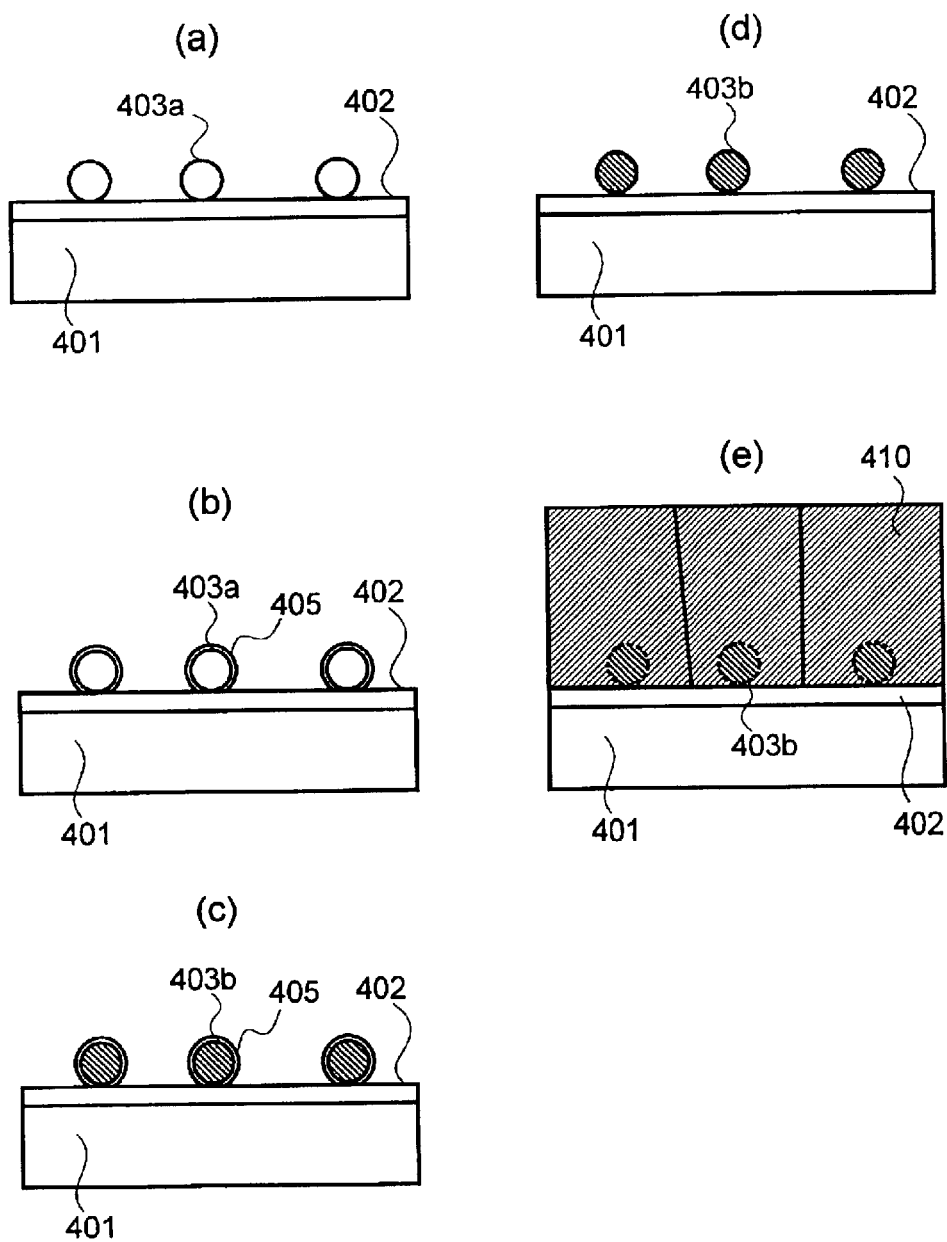
FIG. 38 is a flowchart of a fine grain silicon germanium film forming process which includes a surface modification processing step after forming silicon micro-crystals according to the present invention, and a surface modification layer removal step after crystallization annealing.

Moreover, if the heat treatment temperature is high and the fine particles diffuse and agglomerate before crystallizing, then as shown in FIG. 38, natural oxidization in air should be performed, or a surface modification layer 405 should be formed on the silicon film 403a by wet processing, before placing the piece in the heat treatment device, the surface modification layer 405 subsequently being removed by wet processing after crystallization, whereupon the polysilicon germanium film 410 is formed.

Besides lamp annealing, an oven, RTA, or laser annealing, may be used for the heat treatment for crystallization, with similar results.

To suppress depletion, as shown in FIG. 39, in forming the fine particles, firstly, silicon particles 403a of approximately 3 nm size are formed, a silicon germanium film 404a is formed around each of these to create fine particles of approximately 10 nm size, and crystallization annealing is performed to form combined crystalline fine particles of silicon and silicon germanium (403b and 404b), and if a polysilicon germanium film 410 is then formed thereon, the Ge concentration at the interface is effectively maintained at a uniform value. In the present embodiment, a gate electrode using a silicon germanium film was described, but it is self-evident that the method of manufacturing a highly reliable CMOS by fine grain formation according to the present invention can bring similar benefits in the case of a polysilicon film, by supplying GeH4 gas only. Similarly to the polysilicon germanium film, the grain size and grain size variation relative standard deviation of the polysilicon film at the interface with the oxide film can be restricted to 30 nm or less and 40% or less, respectively.

(Third Embodiment)

There follows a description of a method of manufacturing a CMOSFET using metal gate electrodes, which represents an embodiment of the present invention. The methods of forming the wells and element separating grooves are similar to those of the first embodiment, and hence they are omitted here and a detailed description of the formation of the metal gate electrodes is given.

Figure 40:
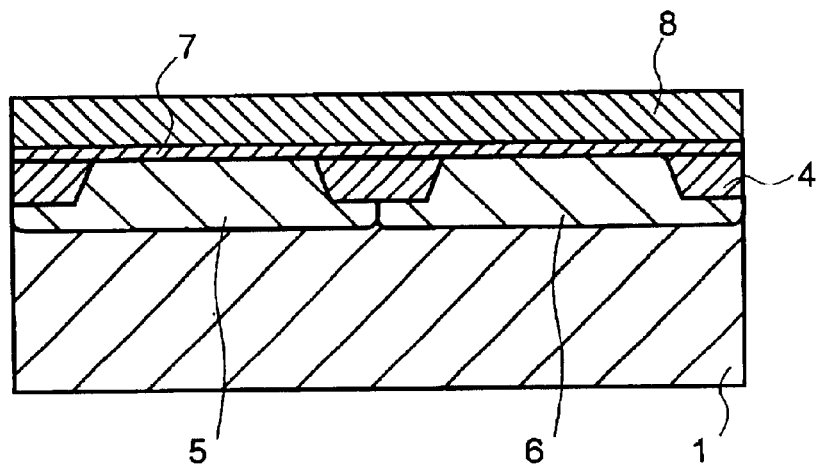
FIG. 40 is a sectional view of a CMOS transistor devices for describing a second embodiment of the present invention.
Figure 41:
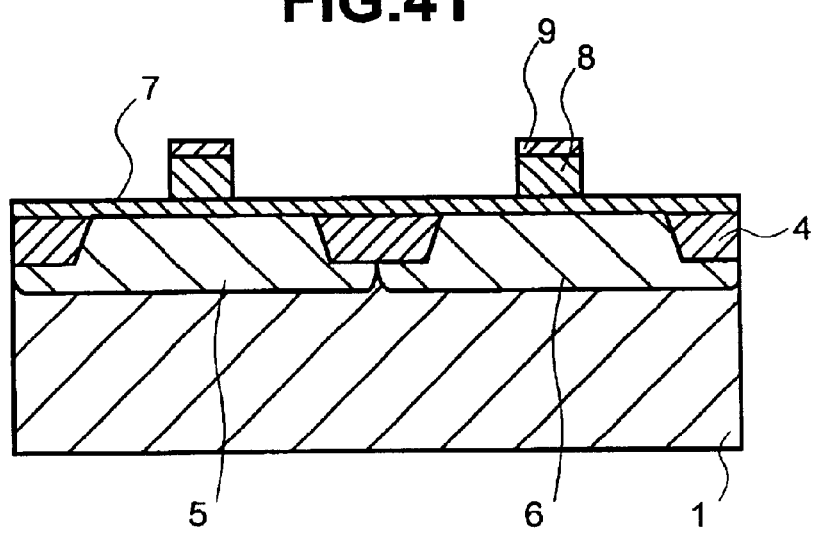
FIG. 41 is a sectional view of a CMOS transistor devices for describing a second embodiment of the present invention.

As shown in FIG. 40, a gate insulating film 7 comprising tantalum oxide is formed to approximately 5 nm by CVD on the surface of a p-type well 5 and an n-type well 6, and a gate electrode film 8 comprising tungsten is formed to approximately 50–100 nm by CVD. As shown in FIG. 41, a silicon nitride film 9 is deposited on the gate electrode film 8, and the silicon nitride film 9 and gate electrode film 8 are dry etched using a resist mask to form gate electrodes.

Figure 42:
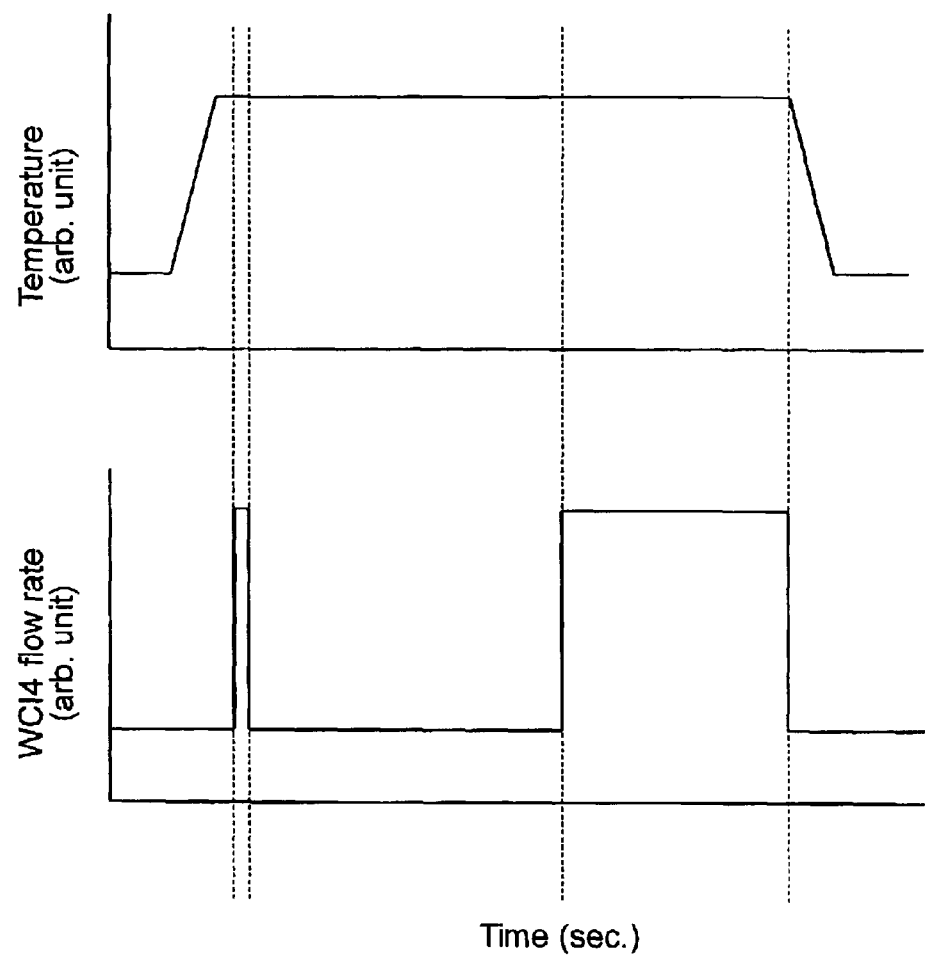
FIG. 42 is a timing chart of gas introduction for forming tungsten fine particles and a tungsten film according to the present invention.

FIG. 42 shows a gas flow for tungsten film formation according to the third embodiment. The supply of WCl$_4$ gas is hearted for a period, and WCl$_4$ gas is supplied after the tungsten film particles has crystallized to sufficient degree.

The processing of forming the tungsten film according to the present invention is illustrated in FIG. 43. FIG. 43(a) shows a state after formation of tungsten fine particles; (b) shows a state after crystallization annealing; (c) shows a state during tungsten film formation; and (d) shows a state after tungsten film formation. Initially, tungsten fine particles 503a having a size of 10 nm or less are formed at 300–600° C. Under these film formation conditions, normally, a crystalline tungsten film is formed, but since these tungsten fine particles have a large surface area, they do not crystallize adequately (FIG. 43(a)). If the tungsten fine particles are grown in this state, then agglomeration will occur and the eventual grain size in the tungsten film will exceed 20 nm.

Therefore, similarly to the second embodiment, after forming the tungsten fine particles, heat treatment is performed at a temperature and for a time which produces crystallization but does not cause diffusion of the tungsten fine particles, and then a tungsten film 610 is grown in crystal form, using the sufficiently crystallized tungsten fine particles 603b as nuclei, whereby the grain size in the vicinity of the interface with the oxide film can be restricted to 20 nm or less (FIG. 43(d)).

More specifically, after forming tungsten fine particles 603a to approximately 3 nm on the tantalum oxide film, the supply of source gas is halted and the piece is left for 5 min whilst crystalline tungsten fine particles 603b form, whereupon the source gas is turned on again, and a tungsten film 610 is formed to 100–150 nm. By optimising the film formation temperature and pressure, the nucleus density of the tungsten fine particles 603a is raised to $10^{11}$/cm$^2$ or above.

Alternatively, after forming tungsten fine particles 603a on a tantalum oxide film at 300–600° C. using a cluster tool wherein a film formation chamber and a high-temperature annealing chamber are connected in a vacuum as illustrated in FIG. 36, the piece is moved to an annealing chamber and heated for between 10 seconds and 3 minutes by lamp annealing at 800–1200° C. The piece is then returned to the film forming device and a tungsten film 610 is formed to 50–100 nm. The film forming conditions may be the same as those for forming the fine particles, but it is desirable to use higher temperature and higher pressure conditions to achieve a quicker film forming speed. Normally, when the film formation temperature is increased, the interface grain size increases, but in this application, the grain size is determined by the initial fine particle density, so film formation at high temperature does not alter the grain size, and hence high-temperature film formation is beneficial in terms of through-put.

Alternatively, it is also possible to perform crystallization annealing in a separate heat treatment device, after forming tungsten fine particles 603a to approximately 3 nm at 300–600° C. Moreover, similarly to the second embodiment, surface modification by oxygen or a halogen gas at low-temperature, or surface modification by wet processing, should be implemented, before placing the piece in the heat treatment device, the surface modification layer formed on the surface of the tungsten fine particles 603a being removed by wet processing after crystallization, whereupon the tungsten film 610 is formed. Alternatively, it is also possible to perform annealing whilst supplying oxygen and a halogen gas and raising the temperature.

Besides lamp annealing, an oven, RTA, or laser annealing, may be used for the heat treatment for crystallization, with similar results.

The tungsten film has a body centred cubic structure, and the thermochemically stage face thereof is the (110) face. Therefore, in the initial growth stages, (110)-oriented particles form readily. However, if there is insufficient crystallization in the initial growth stages, then secondary nuclei apart from the (110)-oriented particles will be formed in the tungsten film. With a metal gate, the transistor characteristics vary with the work function, and therefore the crystals at the insulating film interface should have the same orientation. The surface area ratio of (110)-oriented crystals at the insulating film interface should be 70% or above. Moreover, in X-ray diffraction, the (110) intensity should be at least 0.5 as a ratio of the total intensity for (100), (111) and (110). In the present embodiment, (110)-oriented crystals are formed by heat treatment of tungsten fine particles having a size of 10 nm or less.

Figure 44:
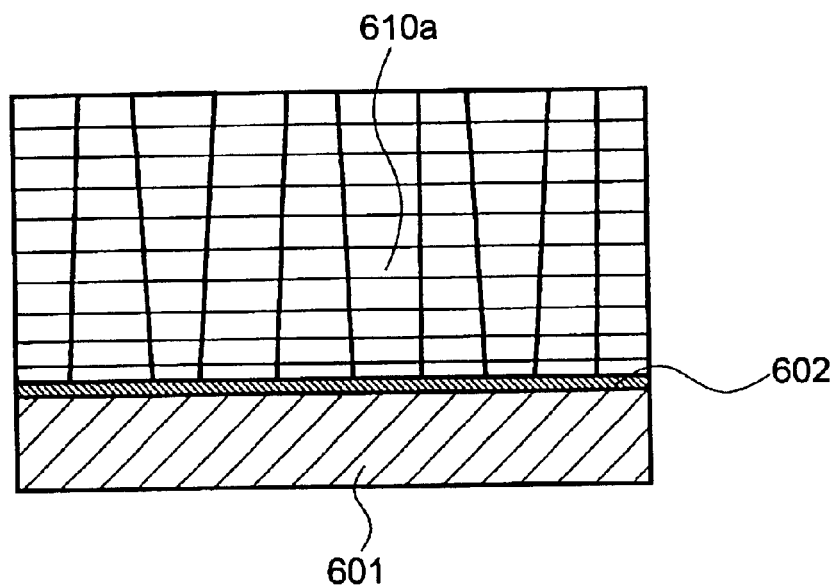
FIG. 44 is a schematic view of a sectional structure of a tungsten film formed by supplying crystalline tungsten fine particles according to the present invention.

Since the (110) face of the tungsten film grows more quickly than the other faces, a pillar-shaped structure having (110) orientation 610a is grown in the direction of the film thickness, as illustrated in FIG. 44. A fine grain tungsten film is obtained wherein the grain size at the interface with the insulating film is 20 nm or less, the variation (relative standard deviation) is 40% or less, and the (110) orientation is 80% or above.

In the present embodiment, an insulating film of Ta2O5 is used, but similar results are obtained using a high dielectric materials, such as silicon nitride, zirconium oxide, hafnium oxide, titanium oxide, SrTiO3, BaTiO3, (Sr, Ba) TiO3, PZT, zirconium silicate, hafnium silicate, or the like.

Moreover, here, tungsten is used for the metallic film, but similar results are obtained if Cr, Mn, Fe, Nb, Mo, Hf, or Ta, having the same body centred cubic structure is used. On the other hand, in Al, Fe, Ni, Cu, Rh, Pd, Ag, In, Ir, Pt, Au and Pb, which have a face centred cubic structure, the (111) face is the thermochemically stable face, and therefore, according to the present embodiment, it is possible to form a fine grain metal film wherein the grain size at the interface with the insulating film is 20 nm or less, the variation (relative standard deviation) is 40% or less, and the (111) orientation is 80% or above. The surface area ratio of the (111)-oriented crystals at the interface with the insulating film should be 70% or above.

Furthermore, in X-ray diffraction, the (111) intensity should be at least 0.5 as a ratio of the total intensity for (100), (111) and (110). Moreover, in the case of Ti, Co, Zn, Zr, Ru and Cd, which have a hexagonal lattice, the thermochemically stable face is the (0001) face, and therefore the surface area ratio of the (0001) orientation at the interface with the insulating film should be 70% or above. In X-ray diffraction, the (0001) intensity should be at least 0.5 as a ratio of the total intensity of the overall diffraction peak intensity.

According to the present embodiment, it is possible to form a fine grain metal film wherein the grain size at the interface with the insulating film is 20 nm or less, the variation (relative standard deviation) is 40% or less, and the (0001) orientation is 80% or above.

In the present embodiment, a pure metal was used for the electrode film, but even if an alloy, oxide or nitride is used, it is similarly possible to form a fine grain electrode film wherein the thermochemically stable face is orientated, the grain size at the insulating film interface is 20 nm or less, and the variation (relative standard deviation) is 40% or less, and the orientation is 80% or above.

In the present embodiment, a cluster tool is used wherein the film forming device and crystallization annealing device are constituted by separate chambers, but adoption of a device wherein the film forming device and annealing device are unified is beneficial in terms of throughput.

Figure 45:
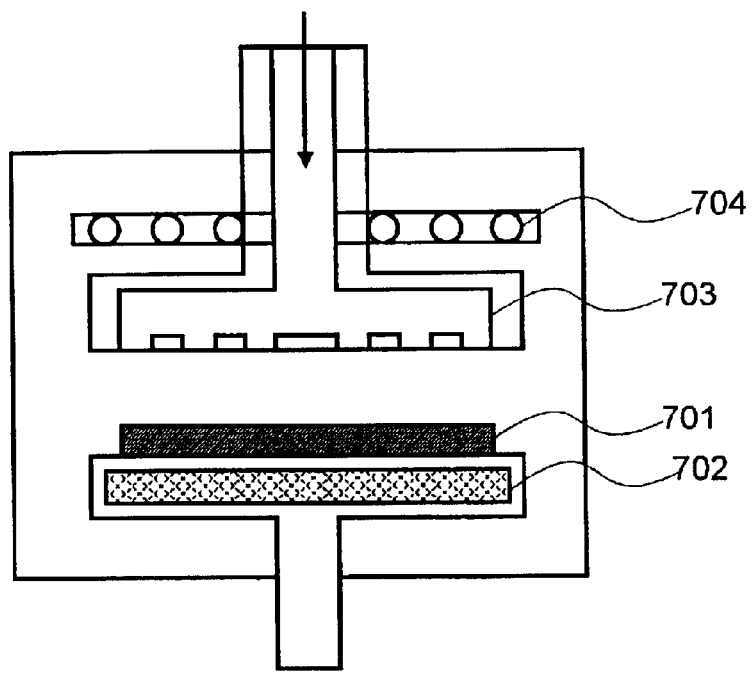
FIG. 45 is a schematic view of a CVD device having a high-speed heat treatment mechanism, used in the present invention.

FIG. 45 shows an apparatus wherein an rapid lamp heating mechanism is provided for crystallization annealing in a CVD device which forms films whilst controlling the substrate temperature by a direct heating mechanism based on a heater. The aforementioned processes of forming tungsten fine particles, performing crystallization and forming an electrode film are carried out in a single chamber.

First, the substrate temperature is adjusted to a film forming temperature (300–600° C.) by a substrate heater 702, and a source gas is supplied, thereby growing a tungsten film 603a to approximately 3 nm on the insulating film. After halting the supply of source gas, crystallization annealing is performed by heating the workpiece to 800–1200° C. at a rate of 100° C./min or above by lamp irradiation 704. Thereupon, the lamp irradiation 704 is halted, and a wait of about 2 minutes is performed until the substrate temperature returns to the film forming temperature, whereupon source gas is supplied and a tungsten film 610 of 50–100 nm is formed.

Similarly to a case where a cluster tool is used, it is possible to form a fine grain electrode film wherein the thermochemically stable face is orientated, the grain size at the interface with the insulating film is 20 nm or less, and the variation (relative standard deviation) is 40% or less. Moreover, in this device, in order to reduce the effects of the rapid heating on film formation, a heating method is adopted whereby the substrate heater output is switched from temperature adjustment to steady output before rapid heating, and temperature adjustment is restarted once the temperature has stabilized after the completion of lamp irradiation.

As described above, the present invention provides MOS transistor devices having high reliability by using a fine grain polysilicon germanium or metal film having reduced film stress for the gate electrode.

What is claimed is:

1. A method of manufacturing a MOS transistor comprising the steps of:
providing a pair of impurity regions of a second conductivity type on a semiconductor substrate of a first conductivity type;
providing an insulating film on said semiconductor substrate in between said impurity regions of a second conductivity type; and
depositing a conducting film on said insulating film, including providing fine particles onto said insulating film, whereby said fine particles are incorporated in said conducting film,
wherein said conducting film and said fine particles are in contact with said insulating film,
wherein said insulating film is an oxide film said fine particles are silicon, and said conducting film is a polycrystalline silicon germanium film, wherein the step of layering said silicon film and polycrystalline silicon germanium film onto said oxide film by CVD comprises a step of forming said silicon film and said polycrystalline silicon germanium film consecutively by changing the mixture ratio of SiH4 and GeH4 as source gases, in a temperature range in which said silicon film is amorphous and said polycrystalline silicon germanium film is crystalline.

2. A method of manufacturing a MOS transistor comprising the steps of:

providing a pair of impurity regions of a second conductivity type on a semiconductor substrate of a first conductivity type;

providing an insulating film on said semiconductor substrate in between said impurity regions of a second conductivity type; and depositing a conducting film on said insulating film, including providing fine particles onto said insulating film, whereby said fine particles are incorporated in said conducting film, wherein said conducting film and said fine particles are in contact with said insulating film, wherein said insulating film is an oxide film said fine particles are silicon, and said conducting film is a polycrystalline silicon germanium film, wherein the step of layering said silicon film and polycrystalline silicon germanium film onto said oxide film by CVD comprises a step of forming said silicon film and a polycrystalline silicon germanium film of 20 nm or less, in a temperature range in which said silicon film is amorphous and said polycrystalline silicon germanium film is crystalline, and furthermore, forming said polycrystalline silicon germanium film at a higher temperature.

* * * * *